(12) United States Patent
Wei et al.

(10) Patent No.: US 11,910,670 B2
(45) Date of Patent: Feb. 20, 2024

(54) DISPLAY SUBSTRATE AND MANUFACTURING METHOD THEREOF, AND COMPENSATING METHOD FOR WIRE LOAD

(71) Applicants: Chengdu BOE Optoelectronics Technology Co., Ltd., Chengdu (CN); BOE TECHNOLOGY GROUP CO., LTD., Beijing (CN)

(72) Inventors: Yulong Wei, Beijing (CN); Mengmeng Du, Beijing (CN); Xiaoqing Shu, Beijing (CN); Jiping Zhao, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 279 days.

(21) Appl. No.: 17/429,800

(22) PCT Filed: Feb. 27, 2020

(86) PCT No.: PCT/CN2020/076970
§ 371 (c)(1),
(2) Date: Aug. 10, 2021

(87) PCT Pub. No.: WO2021/168738
PCT Pub. Date: Sep. 2, 2021

(65) Prior Publication Data
US 2022/0310755 A1    Sep. 29, 2022

(51) Int. Cl.
*H10K 59/131* (2023.01)
*H01L 27/12* (2006.01)
*G09G 3/3233* (2016.01)

(52) U.S. Cl.
CPC ......... *H10K 59/131* (2023.02); *G09G 3/3233* (2013.01); *H01L 27/124* (2013.01);
(Continued)

(58) Field of Classification Search
CPC .. H10K 59/131; H01L 27/124; G09G 3/3233; G09G 2300/0426; G09G 2310/0264
See application file for complete search history.

(56) References Cited

U.S. PATENT DOCUMENTS 10,360,862 B2   7/2019   Yeh et al.
10,559,253 B1   2/2020   Li et al.
(Continued)

FOREIGN PATENT DOCUMENTS

CN    108511466 A    9/2018
CN    108665850 A    10/2018
(Continued)

OTHER PUBLICATIONS

Extended European Search Report in European Application No. 20920757.0 dated Mar. 17, 2023.
(Continued)

*Primary Examiner* — Thanh Y. Tran
(74) *Attorney, Agent, or Firm* — Collard & Roe, P.C.

(57) ABSTRACT

A display substrate and a manufacturing method thereof, and a compensating method for wire load are provided. The display substrate includes a display region and a peripheral region. The display region has an opening, and the peripheral region includes an opening peripheral region at least partially in the opening; at least one wire is provided in the display region and the opening peripheral region. Each of the at least one wire includes two portions, a first portion is spaced apart and insulated from the semiconductor pattern and the conductive pattern, to provide at least one first compensation unit, and a second portion is spaced apart and
(Continued)

insulated from one of the semiconductor pattern and the conductive pattern, to provide at least one second compensation unit.

20 Claims, 14 Drawing Sheets

(52) U.S. Cl.
CPC ............... *G09G 2300/0426* (2013.01); *G09G 2310/0264* (2013.01)

(56) References Cited

U.S. PATENT DOCUMENTS

| | | | |
|---|---|---|---|
| 10,756,159 B2 | 8/2020 | Gu et al. | |
| 2011/0272714 A1* | 11/2011 | Lhee | H10K 59/131 |
| | | | 257/E51.018 |
| 2017/0249896 A1 | 8/2017 | Kim et al. | |
| 2017/0269411 A1* | 9/2017 | Liu | H01L 27/1262 |
| 2017/0301280 A1 | 10/2017 | Ka et al. | |
| 2019/0074344 A1 | 3/2019 | Ka et al. | |
| 2019/0131360 A1 | 5/2019 | Lee et al. | |
| 2019/0148465 A1 | 5/2019 | Yu et al. | |
| 2019/0181213 A1 | 6/2019 | Lim | |
| 2019/0304356 A1 | 10/2019 | Ka et al. | |
| 2019/0392767 A1 | 12/2019 | Kim et al. | |

FOREIGN PATENT DOCUMENTS

| | | |
|---|---|---|
| CN | 108877622 A | 11/2018 |
| CN | 208271545 U | 12/2018 |
| CN | 208444838 U | 1/2019 |
| CN | 109300953 A | 2/2019 |
| CN | 109713012 A | 5/2019 |
| CN | 209843713 U | 12/2019 |
| JP | 2010032964 A | 2/2010 |
| JP | 2019049693 A | 3/2019 |
| KR | 10-2017-0119270 A | 10/2017 |
| KR | 10-2019-0047918 A | 5/2019 |

OTHER PUBLICATIONS

International Search Report of PCT/CN2020/076970 in Chinese, dated Nov. 26, 2020 with English translation.
Notice of Transmittal of the International Search Report of PCT/CN2020/076970 in Chinese, dated Nov. 26, 2020.
Written Opinion of the International Searching Authority of PCT/CN2020/076970 in Chinese, dated Nov. 26, 2020.
Japanese Office Action in Japanese Application No. 2021/568202 dated Oct. 17, 2023 with Engilsh translation.

* cited by examiner

DISPLAY SUBSTRATE AND MANUFACTURING METHOD THEREOF, AND COMPENSATING METHOD FOR WIRE LOAD

CROSS REFERENCE TO RELATED APPLICATIONS

This application is the National Stage of PCT/CN2020/076970 filed on Feb. 27, 2020, the disclosure of which is incorporated by reference.

TECHNICAL FIELD

Embodiments of the present disclosure relate to a display substrate and a manufacturing method thereof, and a compensating method for wire load.

BACKGROUND

At present, display screens of display devices develop in a direction of large-screen and full-screen design. Generally, a display device (such as a mobile phone, a tablet computer, etc.) has a camera device (or an imaging device), and the camera device is usually provided on a side outside the display region of the display screen. However, since the installation of the camera device requires a certain position, it is not conducive to the full-screen and narrow-frame design of the display screen. For example, the camera device may be combined with the display region of the display screen, so that the display region can provide a position for the camera device to maximize the display region of the display screen.

SUMMARY

At least one embodiment of the present disclosure provides a display substrate, the display substrate has a display region and a peripheral region at least partially surrounding the display region, and comprises: a base substrate, a semiconductor pattern, at least one wire, and a conductive pattern, the display region has an opening, and the peripheral region comprises an opening peripheral region at least partially in the opening; the semiconductor pattern and the conductive pattern are on the base substrate and in the opening peripheral region; the at least one wire is in the display region and the opening peripheral region, and is configured to transmit an electrical signal for the display region; each of the at least one wire comprises a first portion and a second portion; and in a direction perpendicular to the base substrate, the first portion is spaced apart and insulated from the semiconductor pattern and the conductive pattern, to provide at least one first compensation unit with a first capacitor structure, and the second portion is spaced apart and insulated from one of the semiconductor pattern and the conductive pattern, to provide at least one second compensation unit with a second capacitor structure.

For example, in the display substrate provided by at least one embodiment of the present disclosure, the at least one wire is on a side of the semiconductor pattern away from the base substrate, and the conductive pattern is on a side of the at least one wire away from the semiconductor pattern.

For example, in the display substrate provided by at least one embodiment of the present disclosure, in the direction perpendicular to the base substrate, the second portion does not overlap with the semiconductor pattern, so as to allow the second portion to be only spaced apart and insulated from the conductive pattern to provide the second capacitor structure.

For example, in the display substrate provided by at least one embodiment of the present disclosure, the display region comprises a first sub-display region and a second sub-display region which are on opposite sides of the opening, the first sub-display region and the second sub-display region respectively comprise a plurality of rows of sub-pixels separated by the opening, and the at least one wire sequentially passes through the first sub-display region, the opening peripheral region, and the second sub-display region; and the at least one wire comprises a first wire for providing a scanning signal for a first sub-pixel row in the first sub-display region and the second sub-display region, and further comprises a second wire for providing a scanning signal for a second sub-pixel row in the first sub-display region and the second sub-display region.

For example, in the display substrate provided by at least one embodiment of the present disclosure, a count of sub-pixels comprised in the first sub-pixel row is identical to a count of sub-pixels comprised in the second sub-pixel row, a count of first compensation units comprised in the first wire is identical to a count of first compensation units comprised in the second wire, and a count of second compensation units comprised in the first wire is identical to a count of second compensation units comprised in the second wire.

For example, in the display substrate provided by at least one embodiment of the present disclosure, a count of sub-pixels comprised in the first sub-pixel row is different from a count of sub-pixels comprised in the second sub-pixel row; and a count of first compensation units comprised in the first wire is different from a count of first compensation units comprised in the second wire, or a count of second compensation units comprised in the first wire is different from a count of second compensation units comprised in the second wire, or the count of first compensation units comprised in the first wire is different from the count of first compensation units comprised in the second wire, and the count of second compensation units comprised in the first wire is different from the count of second compensation units comprised in the second wire.

For example, in the display substrate provided by at least one embodiment of the present disclosure, the display region further comprises a third sub-display region, the first sub-display region, the opening, and the second sub-display region are arranged sequentially in a first direction, the at least one wire extends along the first direction, and the second direction is perpendicular to the first direction; two opposite edges of the third sub-display region in the second direction are respectively aligned with an edge, away from the opening in the second direction, of the first sub-display region, and an edge, away from the opening in the second direction, of the second sub-display region; and the third sub-display region comprises sub-pixels arranged in a plurality of rows and a plurality of columns, and further comprises a plurality of third wires providing a scanning signal for each row of the sub-pixels arranged in the plurality of rows and the plurality of columns and extending along the first direction.

For example, in the display substrate provided by at least one embodiment of the present disclosure, the semiconductor pattern comprises a plurality of semiconductor wires extending along the second direction, and the conductive pattern is continuously provided on a side of the at least one wire away from the semiconductor pattern.

For example, in the display substrate provided by at least one embodiment of the present disclosure, a line width of the at least one wire ranges from 3 µm to 5 µm, and a line width of the semiconductor pattern ranges from 20 µm to 30 µm.

For example, the display substrate provided by at least one embodiment of the present disclosure further comprises a first insulating layer and a second insulating layer, the first insulating layer is on a side of the semiconductor pattern away from the base substrate, the at least one wire is on a side of the first insulating layer away from the semiconductor pattern, and the second insulating layer is on a side of the at least one wire away from the first insulating layer, and the conductive pattern is on a side of the second insulating layer away from the at least one wire; and the first insulating layer and the second insulating layer have a via, and the semiconductor pattern is electrically connected to the conductive pattern through the via in the first insulating layer and the second insulating layer.

For example, the display substrate provided by at least one embodiment of the present disclosure further comprises a power wire pattern electrically connected to the conductive pattern, the power wire pattern is configured to provide an electrical signal for the conductive pattern.

For example, in the display substrate provided by at least one embodiment of the present disclosure, the display region comprises a plurality of sub-pixels, and each of the sub-pixels comprises a pixel circuit; and the pixel circuit comprises a thin film transistor, the thin film transistor comprises an active layer, a gate electrode, a source electrode, and a drain electrode, and the semiconductor pattern and the active layer are provided in an identical layer.

For example, in the display substrate provided by at least one embodiment of the present disclosure, the pixel circuit further comprises a storage capacitor, and the storage capacitor comprises a first capacitor plate and a second capacitor plate; and the gate electrode and the first capacitor plate are provided in an identical layer, and the at least one wire and the second capacitor plate are provided in an identical layer.

For example, in the display substrate provided by at least one embodiment of the present disclosure, the conductive pattern, the source electrode, and the drain electrode are provided in an identical layer.

For example, in the display substrate provided by at least one embodiment of the present disclosure, the display region further comprises a first power line electrically connected to the pixel circuit, and the power wire pattern and the first power line are provided in an identical layer.

For example, in the display substrate provided by at least one embodiment of the present disclosure, each of the sub-pixels further comprises a light-emitting element, the light-emitting element comprises a cathode, an anode, and a light-emitting layer between the cathode and the anode, at least one of the cathode and the anode is electrically connected to the pixel circuit, and the power wire pattern and the anode are provided in an identical layer.

At least one embodiment of the present disclosure provides a compensating method for wire load, which comprises: providing at least one first compensation unit and at least one second compensation unit for a wire, and preliminarily determining a count of the at least one first compensation unit and a count of the at least one second compensation unit; obtaining a load of the wire, and comparing the load of the wire with a reference load to obtain a compensation deviation; and redesigning the count of the at least one first compensation unit and the count of the at least one second compensation unit according to the compensation deviation, in which a display region has an opening, a peripheral region at least partially surrounds the display region, the peripheral region comprises an opening peripheral region at least partially in the opening, the wire is in the display region and the opening peripheral region and is configured to transmit an electrical signal for the display region, opposite sides of the wire are provided with a semiconductor pattern and a conductive pattern, the wire comprises a first portion and a second portion, the first portion is spaced apart and insulated from the semiconductor pattern and the conductive pattern, to provide the at least one first compensation unit with a first capacitor structure, and the second portion is spaced apart and insulated from one of the semiconductor pattern and the conductive pattern, to provide the at least one second compensation unit with a second capacitor structure.

At least one embodiment of the present disclosure provides a manufacturing method of a display substrate, which comprises: forming a display region and a peripheral region at least partially surrounding the display region, in which an opening is formed in the display region, and the peripheral region comprises an opening peripheral region at least partially in the opening; the display substrate comprises a base substrate, a semiconductor pattern, at least one wire, and a conductive pattern; the semiconductor pattern and the conductive pattern are formed on the base substrate and in the opening peripheral region, the at least one wire is formed in the display region and the opening peripheral region, and is configured to transmit an electrical signal for the display region; each of the at least one wire comprises a first portion and a second portion; and in a direction perpendicular to the base substrate, the first portion is spaced apart and insulated from the semiconductor pattern and the conductive pattern, to provide at least one first compensation unit with a first capacitor structure, and the second portion is spaced apart and insulated from one of the semiconductor pattern and the conductive pattern, to provide at least one second compensation unit with a second capacitor structure.

For example, in the manufacturing method of the display substrate provided by at least one embodiment of the present disclosure, the at least one wire is formed on a side of the semiconductor pattern away from the base substrate; the conductive pattern is formed on a side of the at least one wire away from the semiconductor pattern; and in the direction perpendicular to the base substrate, the second portion does not overlap with the semiconductor pattern, so as to allow the second portion to be only spaced apart and insulated from the conductive pattern to provide the second capacitor structure.

For example, the manufacturing method of the display substrate provided by at least one embodiment of the present disclosure further comprises: forming a first insulating layer and a second insulating layer, in which the first insulating layer is formed on a side of the semiconductor pattern away from the base substrate, the at least one wire is formed on a side of the first insulating layer away from the semiconductor pattern, the second insulating layer is formed on a side of the at least one wire away from the first insulating layer, and the conductive pattern is formed on a side of the second insulating layer away from the at least one wire; and the first insulating layer and the second insulating layer have a via, and the semiconductor pattern is electrically connected to the conductive pattern through the via in the first insulating layer and the second insulating layer.

For example, in the manufacturing method of the display substrate provided by at least one embodiment of the present disclosure, forming the display region further comprises:

forming a pixel circuit, in which the pixel circuit comprises a thin film transistor and a storage capacitor, the thin film transistor comprises an active layer, a gate electrode, a source electrode, and a drain electrode, and the storage capacitor comprises a first capacitor plate and a second capacitor plate; and the semiconductor pattern and the active layer are formed in an identical layer, the gate electrode and the first capacitor plate are formed in an identical layer, the at least one wire and the second capacitor plate are formed in an identical layer, and the conductive pattern, the source electrode, and the drain electrode are formed in an identical layer.

For example, the manufacturing method of the display substrate provided by at least one embodiment of the present disclosure further comprises: forming a first power line electrically connected to the pixel circuit and a power wire pattern electrically connected to the conductive pattern, in which the power wire pattern is configured to provide an electrical signal for the conductive pattern, and the power wire pattern and the first power line are formed in an identical layer.

For example, the manufacturing method of the display substrate provided by at least one embodiment of the present disclosure further comprises: forming a power wire pattern electrically connected to the conductive pattern, in which the power wire pattern is configured to provide a fixed electrical signal for the conductive pattern; and forming the display region further comprises forming a light-emitting element, in which the light-emitting element comprises a cathode, an anode, and a light-emitting layer between the cathode and the anode, the power wire pattern and the anode are formed in an identical layer.

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

Figure 1:
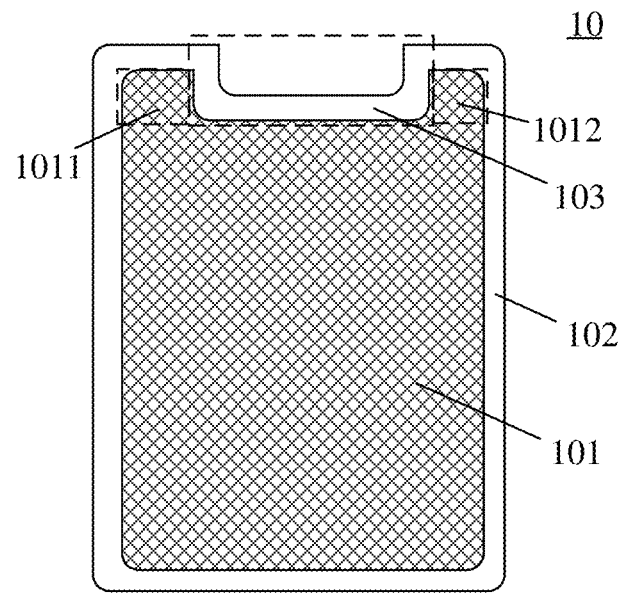
FIG. 1 is a schematic planar diagram of a display substrate.

FIG. 1 is a schematic planar diagram of a display substrate. As illustrated in FIG. 1, the display substrate 10 includes a display region 101 and a peripheral region 102 surrounding the display region 101. The display region 101 is designed, for example, in an irregular shape with a notch 103 on at least one side. Devices, such as a camera, a distance sensor, or the like, may be arranged in the area of the notch 103, thereby contributing to the realization of the narrow frame design of the display substrate 10.

As illustrated in FIG. 1, the display region 101 includes a first sub-display region 1011 and a second sub-display region 1012 which are located on the left and right sides of the notch 103. The first sub-display region 1011 and the second sub-display region 1012 are at the same horizontal position with respect to the bottom edge (the lower edge in the figure) of the display region 101, and are driven, for example, by one or more scanning signal lines (gate lines) extending horizontally in the figure. Due to the existence of the notch 103, the number of sub-pixels in one sub-pixel row in the first sub-display region 1011 and the second sub-display region 1012 is smaller than the number of sub-pixels in one sub-pixel row in other regions of the display region 101 (for example, the middle part in the figure) except for the first sub-display region 1011 and the second sub-display region 1012. Therefore, in the display substrate 10, the number of sub-pixels in one sub-pixel row in the first sub-display region 1011 and the second sub-display region 1012 connected to the signal line which horizontally extends and provides electrical signals (such as a scanning signal) is different from the number of sub-pixels in one sub-pixel row in other regions of the display region 101 except for the first sub-display region 1011 and the second sub-display region 1012 connected to the signal line which provides electrical signals (such as a scanning signal). Further, in the case where the notch 103 has an irregular shape (for example, a trapezoid), the number of sub-pixels in different sub-pixel rows in the first sub-display region 1011 and the second sub-display region 1012 may also be different. Therefore, in the display substrate 10, because the number of sub-pixels in different sub-pixel rows may be different from each other, the loads of the signal lines connecting the sub-pixels in different sub-pixel rows may be different, so that the signal transmission speeds of these signal lines may be different, which will affect the display effect of the display substrate.

For example, load compensation can be performed on these signal lines with different loads, so that the loads of these signal lines can be basically the same. For example, a certain number of compensation units with a capacitor structure can be provided for these signal lines. However, the compensation effect of the compensation unit with a single structure is often limited, for example, the compensation effect obtained by the compensation unit with a single structure can only be an integer multiple of the compensation effect of the compensation unit, and thus sometimes it may not be possible to achieve a more accurate compensation effect.

At least one embodiment of the present disclosure provides a display substrate, a manufacturing method thereof, and a compensating method for wire load. The display substrate includes a display region and a peripheral region at least partially surrounding the display region, and further includes a base substrate, a semiconductor pattern, at least one wire, and a conductive pattern. The display region has an opening, and the peripheral region includes an opening peripheral region at least partially in the opening; the semiconductor pattern and the conductive pattern are on the base substrate and in the opening peripheral region; the at least one wire is in the display region and the opening peripheral region, and is configured to transmit an electrical signal for the display region; each of the at least one wire comprises a first portion and a second portion; and in a direction perpendicular to the base substrate, the first portion is spaced apart and insulated from the semiconductor pattern and the conductive pattern, to provide at least one first compensation unit with a first capacitor structure, and the second portion is spaced apart and insulated from one of the semiconductor pattern and the conductive pattern, to provide at least one second compensation unit with a second capacitor structure. The display substrate uses two different compensation units to compensate for signal lines with different loads, so that more accurate compensation can be achieved by adjusting the number ratio of the two different compensation units, which allows the loads of these signal lines to be basically the same, thereby improving the display effect of the display substrate.

Hereinafter, some specific embodiments are provided to describe the display substrate and the manufacturing method thereof, and the compensating method for wire load of the embodiments of the present disclosure.

Figure 2:
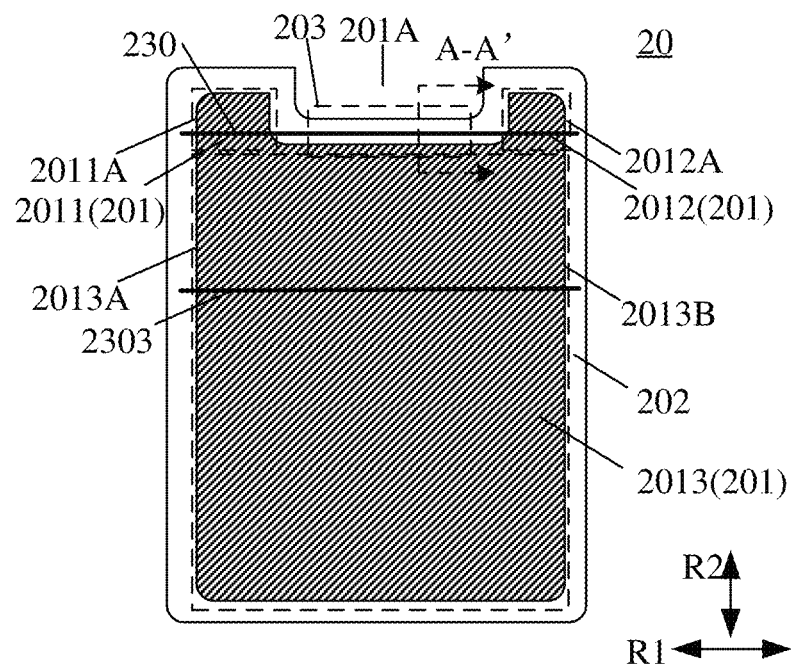
FIG. 2 is a schematic planar diagram of a display substrate provided by at least one embodiment of the present disclosure.
Figure 3A:
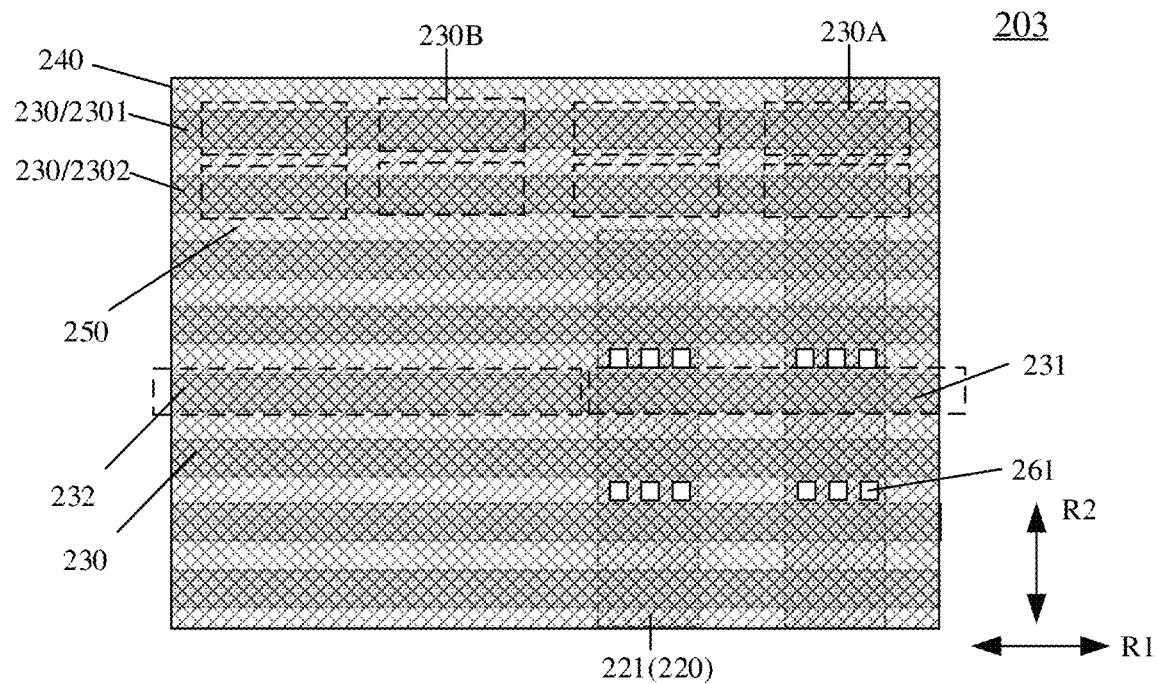
FIG. 3A is a schematic planar diagram of an opening peripheral region of a display substrate provided by at least one embodiment of the present disclosure.
Figure 5A:
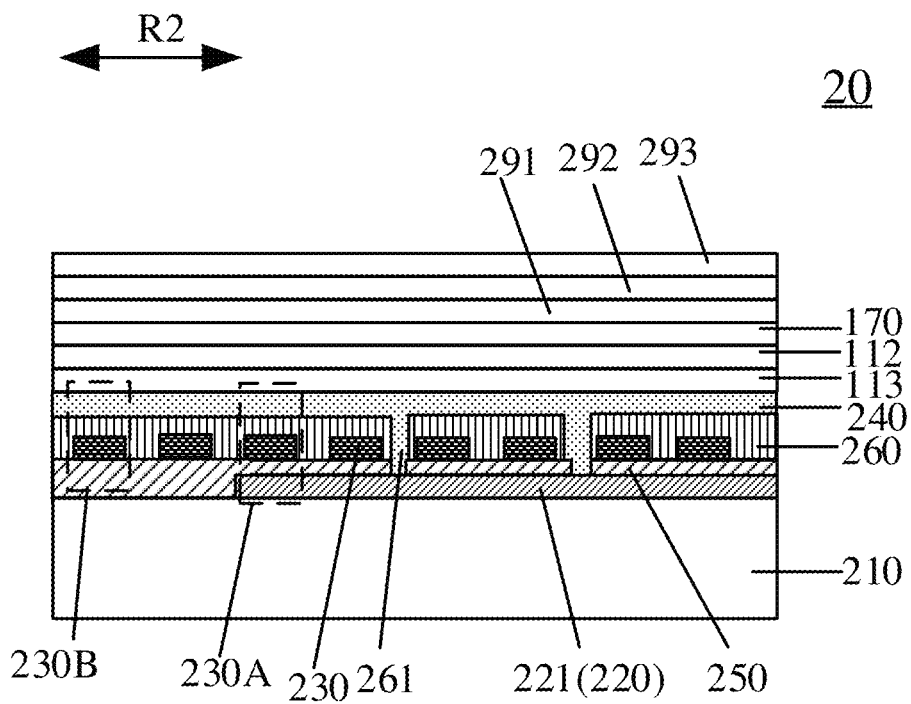
FIG. 5A is a schematic cross-sectional view of an opening peripheral region of the display substrate illustrated in FIG. 2 along a line A-A'.

FIG. 2 shows a schematic planar diagram of a display substrate provided by at least one embodiment of the present disclosure, FIG. 3A shows a schematic planar diagram of an opening peripheral region of the display substrate, and FIG. 5A shows a schematic cross-sectional view of the display substrate illustrated in FIG. 2 along a line A-A'.

As illustrated in FIG. 2, FIG. 3A, and FIG. 5A, the display substrate 20 provided by at least one embodiment of the present disclosure has a display region 201 and a peripheral region 202 at least partially surrounding the display region 201. The display region 201 includes sub-pixels arranged in an array, and various wires for sub-pixels which are used to achieve display functions. The peripheral region 202 includes wires which electrically connect the sub-pixels, contact pads, etc., and the wires in the peripheral region are electrically connected to the wires in the display region (such as a gate line, a data line, etc.) to provide electrical signals (such as a scanning signal, a data signal, etc.) for the sub-pixels.

For example, the display substrate 20 further includes a base substrate 210, a semiconductor pattern 220, at least one wire 230 (a plurality of wires 230 are shown in the figure), and a conductive pattern 240. For example, in some embodiments, the at least one wire 230 is located on a side of the semiconductor pattern 220 away from the base substrate 210, and the conductive pattern 240 is located on a side of the at least one wire 230 away from the semiconductor pattern 220. In this case, the semiconductor patterns 220, the at least one wire 230, and the conductive pattern 240 are sequentially stacked on the base substrate 210.

For example, the display region 201 has an opening 201A, and the peripheral region 202 includes an opening peripheral region 203 at least partially located in the opening 201A. The semiconductor pattern 230 and the conductive pattern 240 are located on the base substrate 210 and located in the opening peripheral region 203, and the at least one wire 230 is located in the display region 201 and the opening peripheral region 203, and extends through the display region 201 and the opening peripheral region 203, and is configured to transmit an electrical signal for the display region 201. As illustrated in FIG. 2, the wire 230 extends horizontally through the display region 201 and the opening peripheral region 203 to provide electrical signals for a plurality of sub-pixels in the display region 201 which are at the same horizontal position as the opening peripheral region 203. For example, the electrical signal may be one or more of a gate scanning signal, a light-emitting control signal, a reset signal, etc., used for the pixel driving circuit in the display region 201.

For example, as illustrated in FIG. 3A and FIG. 5A, in the opening peripheral region 203, the wire 230 includes a first portion 231 and a second portion 232. In a direction perpendicular to the base substrate 210, the first portion 231 is spaced apart and insulated from both the semiconductor pattern 220 and the conductive pattern 240, to provide at least one first compensation unit 230A with a first capacitor structure. In this case, the first capacitor structure includes a capacitor formed by the first portion 231 and the semiconductor pattern 220, and a capacitor formed by the first portion 231 and the conductive pattern 240, that is, the first capacitor structure includes two capacitors connected in parallel. The second portion 232 is spaced apart and insulated from one of the semiconductor pattern 220 and the conductive pattern 240, to provide at least one second compensation unit 230B with a second capacitor structure. In this case, the second capacitor structure includes a capacitor formed by the second portion 232 and the semiconductor pattern 220, or a capacitor formed by the second portion 232 and the conductive pattern 240, that is, the second capacitor structure includes only one capacitor.

Therefore, the display substrate 20 provides two different compensation units for the wire 230 in the opening peripheral region 203. Where the loads of the plurality of wires 230 in the display substrate 20 are different, for example, where the number of sub-pixels in the display region 201 connected by the plurality of wires 230 is different, compensation units can be provided for the wires 230 in the opening peripheral region 203, so that the loads of the different wires 230 used for different sub-pixel rows can be basically the same. In addition, since one compensation unit provides a certain compensation effect, by providing two different compensation units for the wire 230, different combination of two different compensation units can allow the load compensation effect of each wire 230 to be more diversified, so that the compensation effect can be made more accurate, thereby further improving the consistency of the load of each wire 230. Moreover, compared to the manufacturing process of the display substrate provided with only one compensation unit, in the manufacturing process of the display substrate provided with the two different compensation units described above, only the patterning process of the semiconductor pattern 220 or the conductive pattern 240 needs to be changed, for example, by only changing the mask used in the preparation of the semiconductor pattern 220 or the conductive pattern 240, the manufacture of the display substrate provided with one compensation unit can be changed to the manufacture of the display substrate provided with two different compensation units, thereby reducing the difficulty of the transformation of the manufacturing process.

For example, in some embodiments, as illustrated in FIG. 3A and FIG. 5A, in the direction perpendicular to the base substrate 210, the second portion 232 does not overlap with the semiconductor pattern 220, so that the second portion 232 is only spaced apart and insulated from the conductive pattern 240 to provide the second capacitor structure. In this case, in the manufacturing process of the display substrate, the semiconductor pattern 220 located between the base substrate 210 and the second portion 232 of the wire 230 is etched, while the semiconductor pattern 220 between the base substrate 210 and the first portion 231 of the wire 230 is retained, and the conductive pattern 240 above the first portion 231 and the second portion 232 of the wire 230 is retained, so that the second portion 232 is only spaced apart and insulated from the conductive pattern 240, and the first portion 231 is spaced apart and insulated from both the semiconductor pattern 220 and the conductive pattern 240.

Figure 3B:
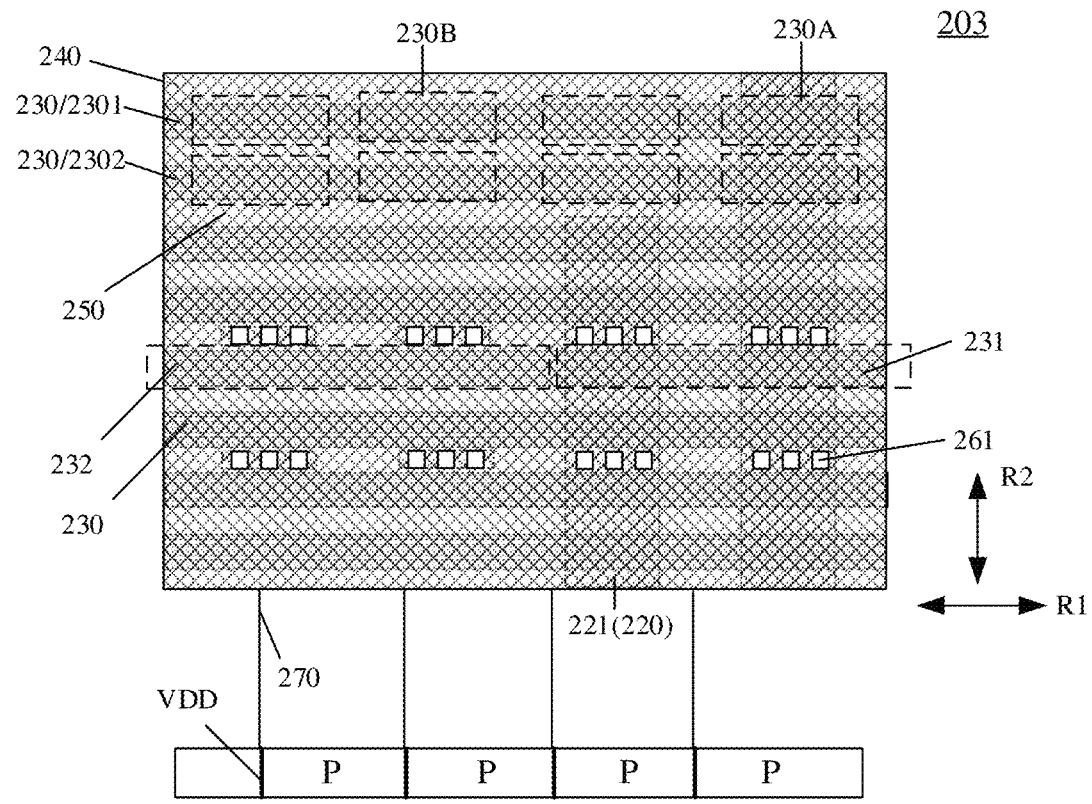
FIG. 3B is another schematic planar diagram of an opening peripheral region of a display substrate provided by at least one embodiment of the present disclosure.

For example, in some embodiments, as illustrated in FIG. 3B, where the semiconductor pattern 220 located between the base substrate 210 and the second portion 232 of the wire 230 is etched, as illustrated in FIG. 3A, the semiconductor pattern between adjacent second portions 232 may be etched, or, as illustrated in FIG. 3B, the semiconductor pattern between the adjacent second portions 232 may also be partially retained. In the above two cases, the second capacitor structure can be formed, and the effect of the partially retained semiconductor pattern on the capacitor may be negligible, so that the formed second capacitor structure is basically the same.

Figure 5B:
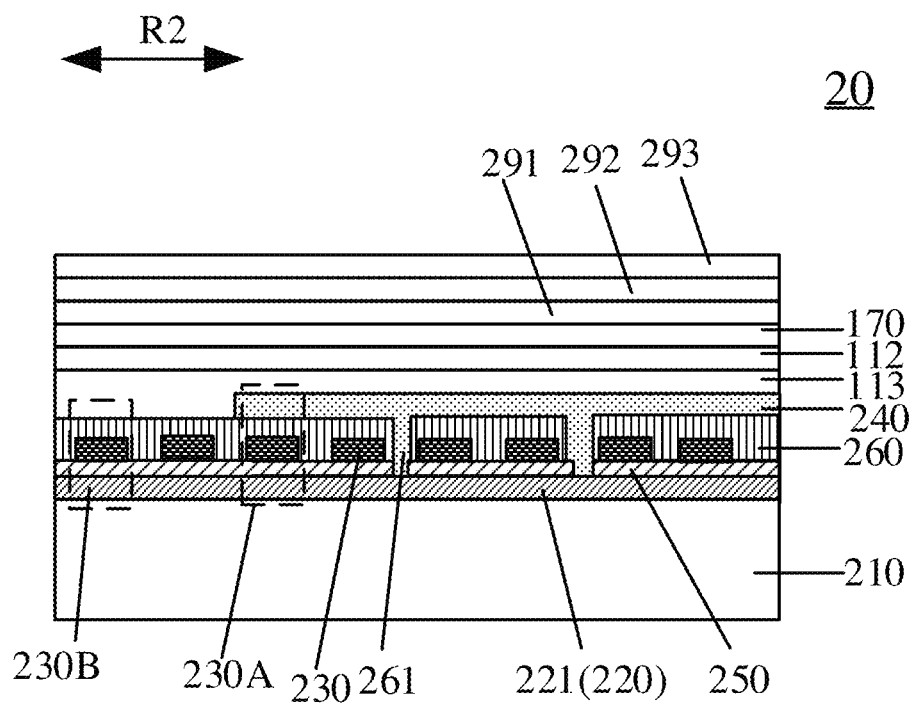
FIG. 5B is another schematic cross-sectional view of an opening peripheral region of the display substrate illustrated in FIG. 2 along the line A-A'.

For example, in other embodiments, as illustrated in FIG. 5B, in the direction perpendicular to the base substrate 210, the second portion 232 of the wire 230 does not overlap with the conductive pattern 240, so that the second portion 232 is only spaced apart and insulated from the semiconductor pattern 220 to provide the second capacitor structure, that is, the second compensation unit 230B. In this case, in the manufacturing process of the display substrate, the conductive pattern 240 located on the second portion 232 of the wire 230 is etched, while the conductive pattern 240 on the first portion 231 of the wire 230 is retained, so that the second portion 232 is only spaced apart and insulated from the semiconductor pattern 220 to provide the second capacitor structure, that is, the second compensation unit 230B, while the first portion 231 is spaced apart and insulated from both the semiconductor pattern 220 and the conductive pattern 240 to provide the first capacitor structure, that is, the first compensation unit 230A. For example, the etched position of the conductive pattern 240 is filled with an insulating material.

For example, in the embodiments of the present disclosure, two structures being spaced apart and insulated from each other may refer to that there is a space between the two structures so as to allow the two structures to be insulated. For example, there may be an insulating material between the two structures. For example, in some embodiments, in the direction perpendicular to the display substrate, at least part of the wire 230 and the semiconductor pattern 220 have an overlapped portion, and there is an insulating layer between the wire 230 and the semiconductor pattern 220, so as to form the capacitor structure. At least part of the wire 230 and the conductive pattern 240 have an overlapped part, and there is an insulating layer between the wire 230 and the conductive pattern 240, so as to facilitate the formation of the capacitor structure.

For example, in some embodiments, as illustrated in FIG. 3A, in the opening peripheral region 203, the wire 230 extends along the first direction R1 (the horizontal direction in the figure), the semiconductor pattern 220 includes a plurality of semiconductor wires 221 extending along the second direction R2 (the vertical direction in the figure), and the second direction R2 intersects the first direction R1, for example, the second direction R2 is perpendicular to the first direction R1, so that the overlapped portion of the wire 230 and the semiconductor wire 221 can form a capacitor. In the opening peripheral region 203, in some embodiments, the conductive pattern 240 may include a plurality of conductive wires extending along the second direction R2, so that the overlapped portion of the wire 230 and the conductive wire can form a capacitor. Alternatively, in some embodiments, as illustrated in FIG. 3A, the conductive pattern 240 is continuously disposed on a side of the at least one wire 230 away from the semiconductor pattern 220, that is, the conductive pattern 240 is disposed in the form of a whole block or is continuously disposed, rather than separate wires, on the side of the at least one wire 230 away from the semiconductor pattern 220, thereby increasing the overlapped area of the conductive pattern 240 and the wire 230, and further increasing the capacitance of the capacitor formed by the conductive pattern 240 and the wire 230.

For example, in some embodiments, the line width of the wire 230 may range from about 3 micrometers to 5 micrometers, such as 4 micrometers, and the line width of the semiconductor wire 221 may range from about 20 micrometers to 30 micrometers, such as 25 micrometers.

For example, the term "about" in the embodiments of the present disclosure refers to being larger or smaller within 5% of the numerical value.

It should be noted that, as illustrated in FIG. 3A, in the embodiments of the present disclosure, a first compensation unit 230A is defined by the overlapped portion where the wire 230 and the semiconductor wire 221 are spaced apart. In this case, the spacing of the adjacent first compensation units 230A is defined by the spacing of the adjacent semiconductor wires 221. Similarly, the area of the overlapped portion where the wire 230 and the semiconductor wire 221 are spaced apart, and the spacing of the adjacent first compensation units 230A may be used to define one second compensation unit 230B and the spacing of the adjacent second compensation units 230B. In this case, since the conductive pattern 240 is continuously arranged, in each compensation unit, the compensation effect of the capacitor formed by the wire 230 and the conductive pattern 240 is also superimposed on the compensation effect of the capacitor formed by the wire 230 and the conductive pattern 240 located in the interval between adjacent compensation units. In this case, the difference between the compensation effects of the first compensation unit 230A and the second compensation unit 230B is the compensation effect provided by the capacitor formed by the wire 230 and the semiconductor wire 221 in each first compensation unit 230A. In addition, in other embodiments of the present disclosure, the first compensation unit 230A and the second compensation unit 230B may also be divided in other manners, as long as different compensation units with different compensation effects can be formed.

For example, in some embodiments, as illustrated in FIG. 2 and FIG. 3A, the display region 201 includes a first sub-display region 2011 and a second sub-display region 2012 located on opposite sides of the opening 201A (left and right sides in the figure). The first sub-display region 2011 and the second sub-display region 2012 respectively include a plurality of rows of sub-pixels separated by the opening 201A, and the plurality of rows of sub-pixels in the first sub-display region 2011 and the plurality of rows of sub-pixels in the second sub-display region 2012 are in one-to-one correspondence. For example, the sub-pixels in the n-th row (n is a positive integer) of the first sub-display region 2011 correspond to the sub-pixels in the n-th row of the second sub-display region 2012, which are located in the same row from the perspective of the display effect, and thus regarded as the same row of sub-pixels in the display region in the present disclosure. The plurality of wires 230 sequentially pass through the first sub-display region 2011, the opening peripheral region 203, and the second sub-display region 2012, to provide scanning signals for the plurality of rows of sub-pixels in the first sub-display region 2011 and the second sub-display region 2012, respectively. In this case, the plurality of wires 230 are scanning signal lines (i.e., gate lines).

For example, the at least one wire 230 includes a first wire 2301 that provides a scanning signal for the first sub-pixel row in the first sub-display region 2011 and the second sub-display region 2012, and a second wire 2302 that provides a scanning signal for the second sub-pixel row in the first sub-display region 2011 and the second sub-display region 2012.

For example, in some embodiments, the number of sub-pixels included in the first sub-pixel row is the same as the number of sub-pixels included in the second sub-pixel row. In this case, the loads of the first wire 2301 and the second wire 2302 are basically the same, and therefore the number of the first compensation units 230A included in the first wire 2301 may be the same as the number of the first compensation units 230A included in the second wire 2302, and the number of the second compensation units 230B included in the first wire 2301 may also be the same as the number of the second compensation units 230B included in the second wire 2302, thereby providing substantially the same load compensation for the first wire 2301 and the second wire 2302, so that the loads of the first wire 2301 and the second wire 2302 remain basically the same and reach the ideal load.

For example, in other embodiments, the number of sub-pixels included in the first sub-pixel row is different from the number of sub-pixels included in the second sub-pixel row. In this case, the number of first compensation units 230A included in the first wire 2301 is different from the number of first compensation units 230A included in the second wire 2302; or the number of second compensation units 230B included in the first wire 2301 is different from the number of second compensation units 230B included in the second wire 2302; or the number of first compensation units 230A included in the first wire 2301 is different from the number of first compensation units 230A included in the second wire 2302, and the number of second compensation units 230B included in the first wire 2301 is different from the number of second compensation units 230B included in the second wire 2302, so that by providing different compensation units for the first wire 2301 and the second wire 2302, the loads of the first wire 2301 and the second wire 2302 are basically the same and reach the ideal load.

Figure 4A:
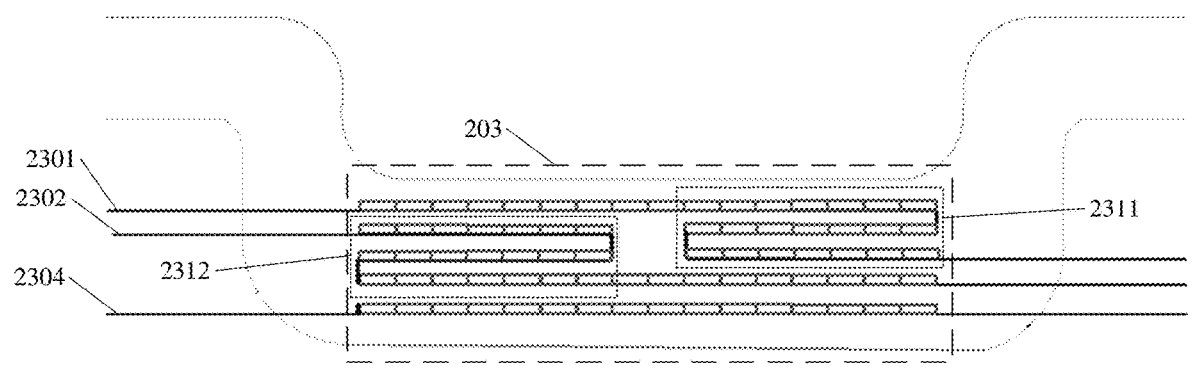
FIG. 4A is a partial enlarged view of the display substrate illustrated in FIG. 2.
Figure 4B:
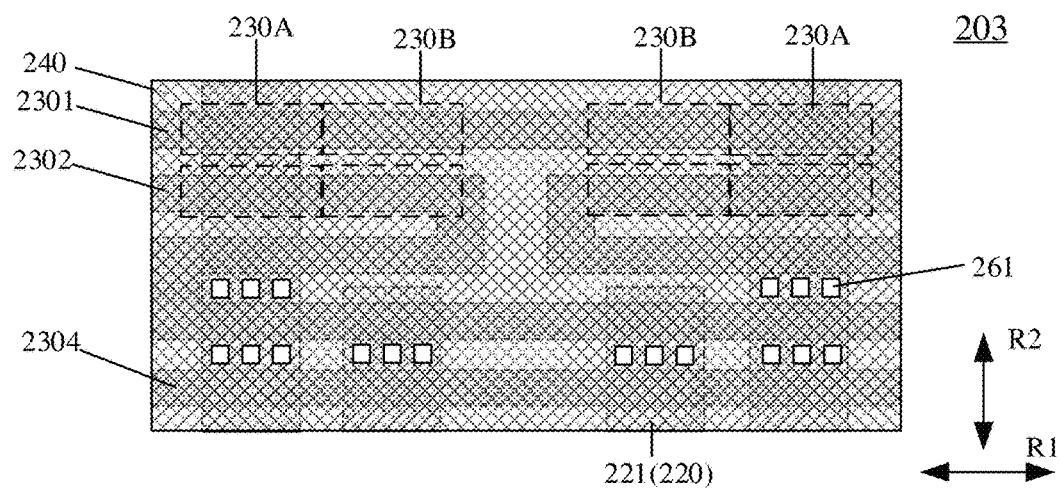
FIG. 4B is still another schematic planar diagram of an opening peripheral region of a display substrate provided by at least one embodiment of the present disclosure.
Figure 4C:
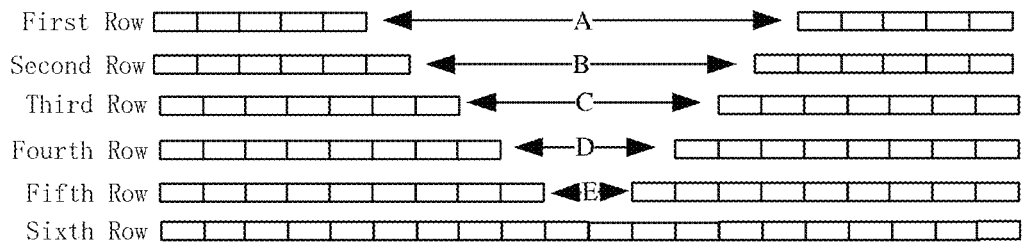
FIG. 4C is a schematic planar diagram of arrangement of sub-pixels near an opening peripheral region of a display substrate provided by at least one embodiment of the present disclosure.

For example, FIG. 4C shows six sub-pixel rows near the opening peripheral region. For example, in some examples, as illustrated in FIG. 4C, suppose that the sixth sub-pixel row is a full sub-pixel row, where the total load is M, and the first to fifth sub-pixel rows include sub-pixels on both sides of the opening, where sub-pixels in each sub-pixel row are not full, and from the first sub-pixel row to the fifth sub-pixel row, the number of sub-pixels gradually increases. In this case, compensation units are provided for the first to fifth sub-pixel rows, so that the load of each sub-pixel row is closer to or substantially equal to M. For example, the total capacitance of the compensation unit provided for the first to fifth sub-pixel rows is gradually reduced.

For example, in some examples, due to the limited space for providing compensation units, such as from the first sub-pixel row to the fifth sub-pixel row, the lengths of the compensation space are A, B, C, D, and E, respectively. After compensation, the total load of each row of the first to fifth sub-pixel rows may also be difficult to reach M. In this case, the total load of each row of the first to fifth sub-pixel rows can be gradually increased, that is, a compensation scheme of load gradual change is adopted.

For example, after compensation, the total loads of the first to fifth sub-pixel rows are V/100×M, U/100×M, T/100× M, S/100×M, and R/100×M, respectively, where R>S>T>U>V, R and R, S, T, U, and V are respectively the shares occupied by the loads of the first to fifth sub-pixel rows when M being 100 shares.

Taking the fifth sub-pixel row as an example, in a space of length E, by placing X first compensation units and Y second compensation units, the total load of the fifth sub-pixel row can be made R/100×M. Assuming that the total capacitance of a first compensation unit is P, and the total capacitance of a second compensation unit is Q, then (X×P)+(Y×Q)+(the total load of the fifth sub-pixel row before compensation, that is, the total load of the sub-pixels on the left and right sides of the E space)=R/100×M.

It can be seen from the capacitance formula C=εS/d that the capacitance of a capacitor depends on the overlapping area of the two capacitor substrates and distance between the two capacitor substrates in the capacitor. Therefore, by designing the widths of the wire 230 and the semiconductor wire 221, the distance between the wire 230 and the semiconductor wire 221, and the distance between the wire 230 and the conductive pattern 240, the required total capacity P of the first compensation unit and the required total capacity Q of the second compensation unit can be obtained.

In some examples, due to process requirements or other requirements, the total load of the fifth sub-pixel row needs to be changed to R1/100×M. In this case, only the preparation process of the semiconductor pattern 220 or the conductive pattern 240 needs to be changed. For example, the mask for manufacturing the semiconductor pattern 220 or the conductive pattern 240 is changed, the original first compensation unit is changed to the second compensation unit, or the original second compensation unit is changed to the first compensation unit, the compensation provided for the fifth sub-pixel row is changed, and the total load of the fifth sub-pixel row is changed to R1/100×M. Assuming that the number of the first compensation unit after the change is X1 and the number of the second compensation unit after the change is Y1, then (X1×P)+(Y1×Q)+(the total load of the fifth sub-pixel row before compensation, that is, the total load of the sub-pixels on the left and right sides of the E space)=R1/100×M. If in the process of changing the compensation unit, W first compensation units are replaced with the second compensation units, then Y1=Y+W, and X1=X−W. If in the process of changing the compensation unit, H second compensation units are replaced with the first compensation units, then Y1=Y−H, and X1=X+H.

Therefore, in the manufacturing process of the display substrate provided by the embodiments of the present disclosure, by changing the manufacturing process of a functional layer, for example, changing the mask for manufacturing the semiconductor pattern 220 or the conductive pattern 240, the compensation provided for one sub-pixel row can be changed, and by designing the size and number of the first compensation unit and the second compensation unit, the required compensation can be obtained.

For example, in some embodiments, the first wire 2301 and the second wire 2302 may pass through the opening peripheral region 203 in a substantially linear shape. In other embodiments, as illustrated in FIG. 4A and FIG. 4B, the first wire 2301 and the second wire 2302 may pass through the opening peripheral region 203 in a non-linear shape. For example, in the opening peripheral region 203, the first wire 2301 may include a first bent portion 2311, the second wire 2302 may include a second bent portion 2312, and the first bent portion 2311 and the second bent portion 2312 are arranged side by side in the first direction R1. The S-shaped bent portion can provide a larger load compensation space.

For example, in some embodiments, the first bent portion 2311 includes at least one S-shaped bent portion; or, the second bent portion 2312 includes at least one S-shaped bent portion; or, each of the first bent portion 2311 and the second bent portion 2312 includes at least one S-shaped bent portion. For example, when the load compensation that can be set in the space provided by one S-shaped bent portion is insufficient to meet the compensation requirement, the first bent portion 2311 and the second bent portion 2312 may include multiple S-shaped bent portions to increase the arrangement space of the load.

For example, in some embodiments, as illustrated in FIG. 2, the display region 201 further includes a third sub-display region 2013, and the first sub-display region 2011, the opening 201A, and the second sub-display region 2012 are sequentially arranged in the first direction R1 (that is, the horizontal direction shown in the figure). The wire 230 extends along the first direction R1, the second direction R2 (i.e., the vertical direction in the figure) is perpendicular to the first direction R1, and two opposite edges 2013A and 2013B of the third sub-display region 2013 in the second direction R2 are respectively aligned with an edge 2011A, away from the opening 201A in the second direction R2, of the first sub-display region 2011, and an edge 2012A, away from the opening 201A in the second direction R2, of the second sub-display region 2012. The third sub-display region 2013 includes sub-pixels arranged in a plurality of rows and a plurality of columns, and further includes a plurality of third wires 2303 (one third wire 2303 is shown as an example in the figure) providing a scanning signal for each row of the sub-pixels arranged in the plurality of rows and the plurality of columns and extending along the first direction R1. As illustrated in FIG. 2, the first sub-display region 2011, the opening 201A, the second sub-display region 2012, and the third sub-display region 2013 constitute a rectangular region as a whole. For example, in other embodiments, the first sub-display region 2011, the opening 201A, the second sub-display region 2012, and the third sub-display region 2013 may also have other shapes, such as regular patterns including a circle, a square, etc., or other irregular patterns, and the embodiments of the present disclosure are not specifically limited in this aspect.

For example, in the third sub-display region 2013, the number of sub-pixels electrically connected to each of the plurality of third wires 2303 is the same, and thus the plurality of third wires 2303 have substantially the same load. For example, due to the compensation of the first compensation unit 230A and the second compensation unit 230B, the load of each wire 230 in the first sub-display region 2011 and the second sub-display region 2012 is substantially the same as the load of each of the plurality of third wires 2303, so that the signal transmission speed of each wire 230 is substantially the same as the signal transmission speed of each third wire 2303. Thus, the display consistency of the display substrate 20 can be maintained, and the display effect of the display substrate 20 can be improved.

For example, in the design process of the display substrate 20, the load of the third wire 2303 can be used as the reference load, and the load of each wire 230 passing through the opening peripheral region 203 can be adjusted. For example, a certain number of the first compensation unit 230A and the second compensation unit 230B may be provided for each wire 230, so that the load of each wire 230 is substantially the same as the load of the third wire 2303. For example, in the case where the number of sub-pixels electrically connected to the first wire 2301 and the second wire 2302 is different, the first wire 2301 and the second wire 2302 are provided with different numbers of the first compensation unit 230A and the second compensation unit 230B, so that the loads of the first wire 2301, the second wire 2302, and the third wire 2303 are basically the same.

For example, in some embodiments, as illustrated in FIG. 4A and FIG. 4B, in the display substrate 20, the wires 230 further include a fourth wire 2304 disposed in the same layer as the first wire 2301 and the second wire 2302. The fourth wire 2304 sequentially passes through the first sub-display region 2011, the opening peripheral region 203, and the second sub-display region 2012. For example, the fourth wire 2304 extends along the first direction R1 and extends linearly, and the fourth wire 2304 is used to provide a scanning signal for the third sub-pixel row arranged in the first direction R1 in the first sub-display region 2011 and the second sub-display region 2012.

For example, the fourth wire 2304 is spaced apart and insulated from at least one of the semiconductor pattern 220 and the conductive pattern 240, so as to be able to form a capacitor. For example, the fourth wire 2304 may be spaced apart and insulated from both the semiconductor pattern 220 and the conductive pattern 240 to form a capacitor; or the fourth wire 2304 may be spaced apart and insulated from one of the semiconductor pattern 220 and the conductive pattern 240 to form a capacitor; or a part of the fourth wire 2304 is spaced apart and insulated from one of the semiconductor pattern 220 and the conductive pattern 240 to form a capacitor, and another part of the fourth wire 2304 is spaced apart and insulated from both the semiconductor pattern 220 and the conductive pattern 240 to form a capacitor. Thus, the fourth wire 2304 can perform load compensation by a different form of capacitor structure formed with the semiconductor pattern 220 and the conductive pattern 240.

For example, in some embodiments, the number of sub-pixels included in the third sub-pixel row is larger than the number of sub-pixels included in the first sub-pixel row; or the number of sub-pixels included in the third sub-pixel row is larger than the number of sub-pixels included in the second sub-pixel row; or the number of sub-pixels included in the third sub-pixel row is larger than the number of sub-pixels included in the first sub-pixel row, and also larger than the number of sub-pixels included in the second sub-pixel row. Since the number of sub-pixels included in the third sub-pixel row is larger than the number of sub-pixels included in the first sub-pixel row and the number of sub-pixels included in the second sub-pixel row, the fourth wire 2304 requires less load compensation. In this case, the fourth wire 2304 can be fully compensated by a few capacitor structures. Therefore, the fourth wire 2304 can sequentially pass through the first sub-display region 2011, the opening peripheral region 203, and the second sub-display region 2012 in a linear shape without bent portions.

For example, in some embodiments, as illustrated in FIG. 5A, the display substrate 20 further includes a first insulating layer 250 and a second insulating layer 260. The first insulating layer 250 is located on a side of the semiconductor pattern 220 away from the base substrate 210, the at least one wire 230 is located on a side of the first insulating layer 250 away from the semiconductor pattern 220, the second insulating layer 260 is located on a side of the at least one wire 230 away from the first insulating layer 250, and the conductive pattern 240 is located on a side of the second insulating layer 260 away from the at least one wire 230. Thus, the first insulating layer 250 insulates the semiconductor pattern 220 and the wire 230 at intervals to form the first compensation unit 230A having the first capacitor structure, and the second insulating layer 260 insulates the wire 230 and the conductive pattern 240 at intervals to form the second compensation unit 230B having the second capacitor structure.

For example, the first insulating layer 250 and the second insulating layer 260 have a via 261, and the semiconductor pattern 220 and the conductive pattern 240 are electrically connected through the via 261 in the first insulating layer 250 and the second insulating layer 260, so that the semiconductor pattern 220 can have the same electrical level as the conductive pattern 240.

Figure 5C:
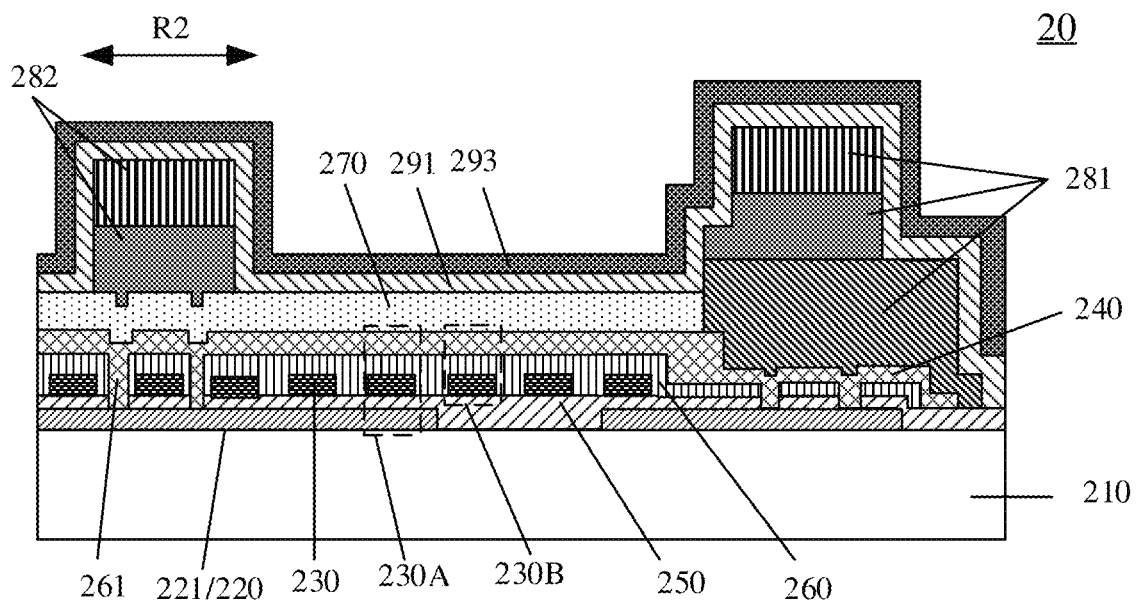
FIG. 5C is still another schematic cross-sectional view of an opening peripheral region of the display substrate illustrated in FIG. 2 along the line A-A'.

For example, in some embodiments, as illustrated in FIG. 5C, the display substrate 20 may further include a first dam 281 and a second dam 282 located on both sides of the opening peripheral region 203. For example, in the direction perpendicular to the base substrate 210, that is, in the vertical direction in the figure, a plurality of vias 261 overlap with the first dam 281 and/or the second dam 282. In this case, a part of the semiconductor pattern 220 located between the first dam 281 and the second dam 282 may be etched, so that the second portion of the wire 230 is only spaced apart and insulated from the conductive pattern 240 at the position where the semiconductor pattern 220 is etched, so as to form the second compensation unit 230B having the second capacitor structure. For example, in FIG. 5C, the plurality of vias 261 are only provided under the first dam 281 and/or the second dam 282. In this case, there is no via 261 provided at the position between the first dam 281 and the second dam 282, so that the up-and-down phenomenon, which may occur due to the existence of the via, of the surface of the conductive pattern 240 located between the first dam 281 and the second dam 282 can be eliminated or alleviated, so that the film surface of the conductive pattern 240 can be uniform and flat. Furthermore, the surfaces of the insulating layer(s) and the encapsulation layer(s) covering the conductive pattern 240 can be kept uniform and flat, thereby avoiding or reducing possible cracks on the surface of the encapsulation layer, improving the uniformity and consistency of the encapsulation layer, and further improving the encapsulation effect of the encapsulation layer on the display substrate.

For example, in other embodiments, the semiconductor pattern 220 and the conductive pattern 240 may not be electrically connected through the via, but are provided separately, so that the semiconductor pattern 220 and the conductive pattern 240 can have different electrical levels.

For example, in some embodiments, the display substrate 10 further includes a power wire pattern electrically connected to the conductive pattern 240. The power wire pattern is configured to provide an electrical signal for the conductive pattern 240, and the electrical signal may be a fixed electrical signal in any form, instead of a pulse signal.

For example, in some embodiments, functional structures such as the semiconductor pattern 220, the at least one wire 230, and the conductive pattern 240 in the opening peripheral region 203 can be arranged in the same layers as some functional structures in the display region 201, so as to simplify the manufacture of the display substrate.

In some embodiments, as illustrated in FIG. 5A and FIG. 5B, the side of the conductive pattern 240 away from the base substrate 210 is provided with an insulating layer 113, a first planarization layer 112, a pixel definition layer 170, a first inorganic encapsulation layer 291, an organic encapsulation layer 292, and a second inorganic encapsulation layer 293. For example, these functional layers all extend from the display region, so as to be arranged in the same layers and integrally connected with the corresponding functional layers in the display region.

Figure 5D:
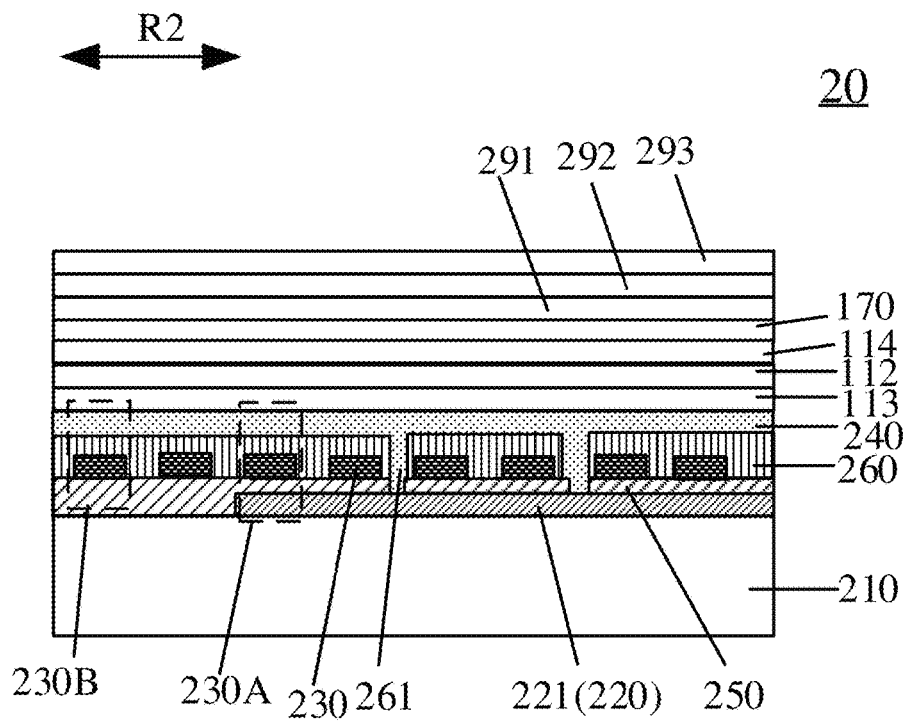
FIG. 5D is further still another schematic cross-sectional view of an opening peripheral region of the display substrate illustrated in FIG. 2 along the line A-A'.
Figure 5E:
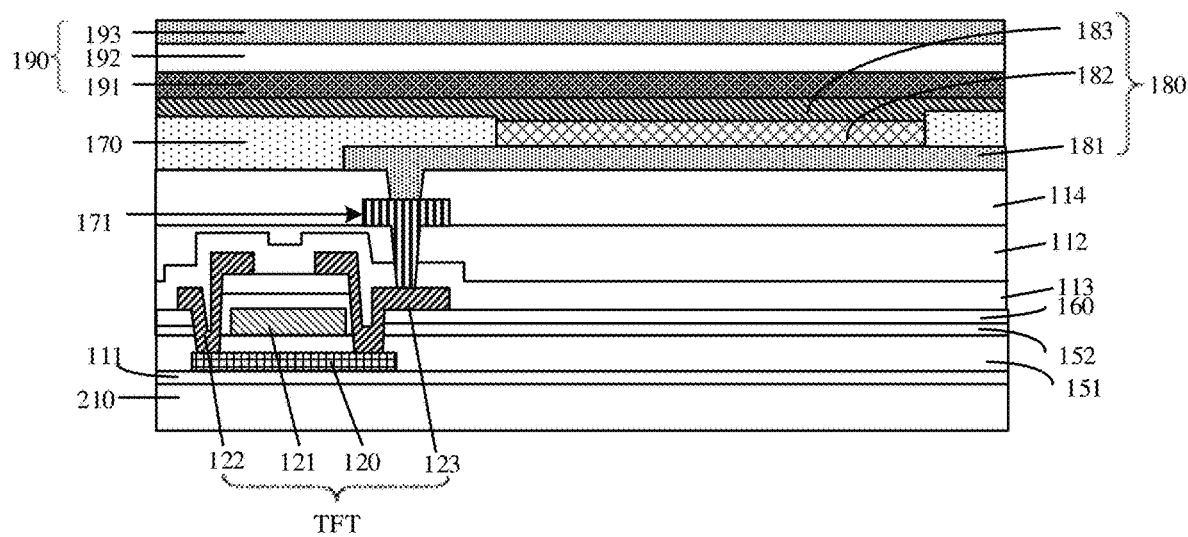
FIG. 5E is a schematic cross-sectional view of a display region of the display substrate illustrated in FIG. 2 along the line A-A'.
Figure 6:
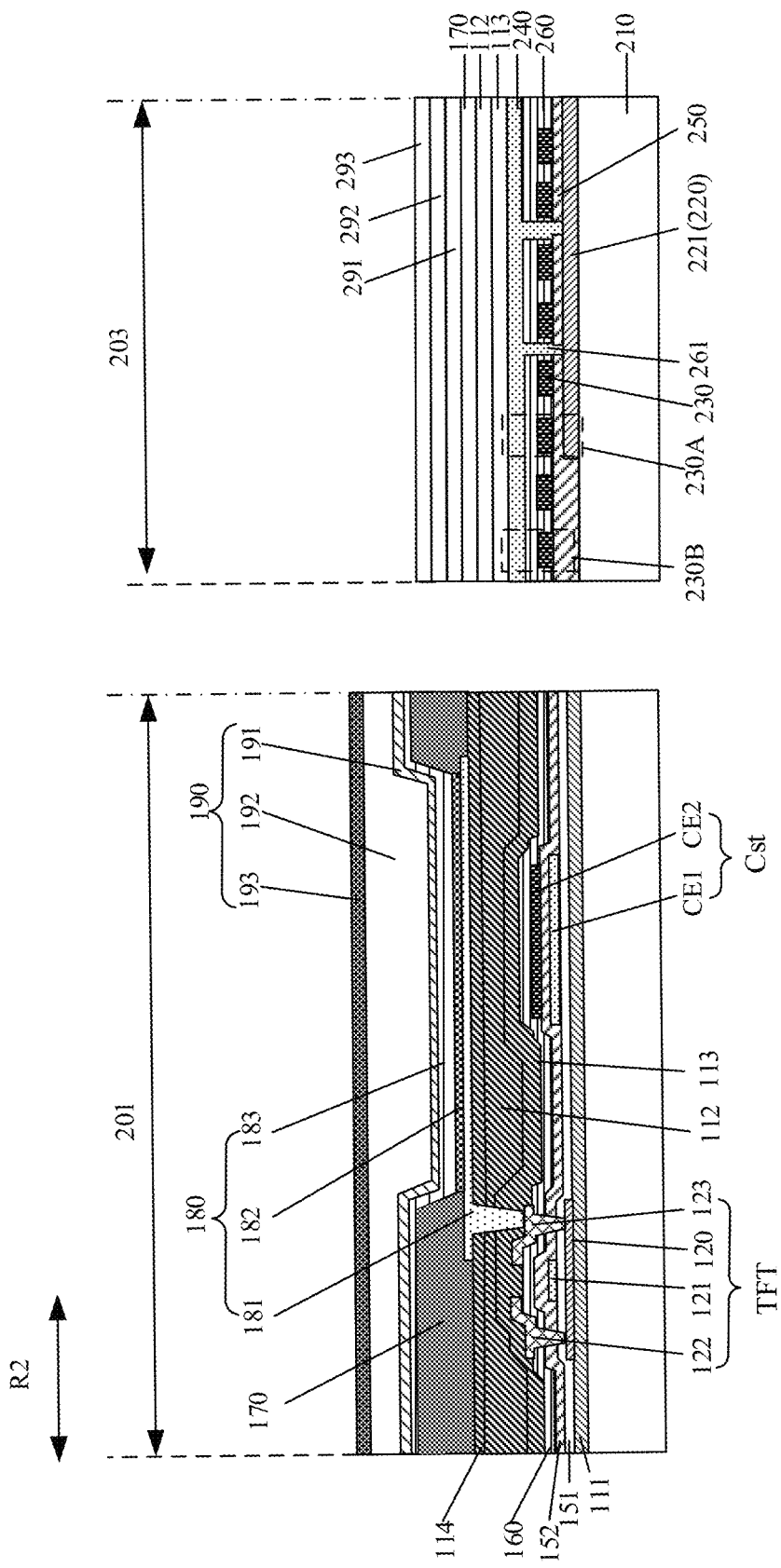
FIG. 6 is a schematic cross-sectional view of a display region and an opening peripheral region of the display substrate illustrated in FIG. 2 along the line A-A'.

For example, in other embodiments, as illustrated in FIG. 5D, the insulating layer 113, the first planarization layer 113, the second planarization layer 114, the pixel definition layer 170, the first inorganic encapsulation layer 291, the organic encapsulation layer 292, and the second inorganic encapsulation layer 293 are provided on the side of the conductive pattern 240 away from the base substrate 210. Compared with the foregoing embodiment, the peripheral region 203 in FIG. 5D has an additional second planarization layer 114. In this case, a partial cross-sectional view of the display region is shown in FIG. 5E, the difference from the display region illustrated in FIG. 6 is that in the display region illustrated in FIG. 5E, the anode 181 of the light-emitting element 180 is electrically connected to the drain electrode 123 of the thin film transistor TFT through the transfer electrode 171. In this case, the transfer electrode 171 is covered by the second planarization layer 114, the second planarization layer 114 extends into the opening peripheral region 203, thereby forming the structure as illustrated in FIG. 5D.

For example, in other embodiments, the display region of the display substrate may not have the insulating layer 113 or the second planarization layer 114.

It should be noted that in the embodiments of the present disclosure, "in the identical/same layer" means that two functional layers or structural layers are formed in the same layer and with the same material in the hierarchical structure of the display substrate, that is, in the manufacturing process, the two functional layers or structural layers can be formed through the same material layer, and the required pattern and structure can be formed by the same patterning process. For example, the material layer can be subjected to the patterning process after the material layer is formed first.

For example, the display substrate 20 may be various types of display substrates such as an organic light-emitting display substrate, a quantum dot light-emitting display substrate, a liquid crystal display substrate, or the like. For example, taking an organic light-emitting display substrate as an example, the display region of the display substrate 201 includes a plurality of sub-pixels arranged in an array, and each sub-pixel includes a light-emitting element (an organic light-emitting diode) and a pixel circuit that provides a driving signal for the light-emitting element.

For example, as illustrated in FIG. 6, each sub-pixel in the display region 201 of the display substrate 20 includes a pixel circuit, and the pixel circuit includes a thin film transistor TFT and a storage capacitor Cst. The thin film transistor TFT includes an active layer 120, a gate electrode 121, and source and drain electrodes 122/123. The storage capacitor Cst includes a first capacitor plate CE1 and a second capacitor plate CE2. For example, the semiconductor pattern 220 may be provided in the same layer as the active layer 120; the gate electrode 121 may be provided in the same layer as the first capacitor plate CE1; the at least one wire 230 may be provided in the same layer as the second capacitor plate CE2; and the conductive pattern 240 may be provided in the same layer as the source and drain electrodes 122 and 123. Therefore, the manufacturing process of the display substrate 20 can be simplified.

For example, in other embodiments, the conductive pattern may also be provided in the same layer as the gate electrode and the first capacitor plate; or, a part of the conductive pattern may be provided in the same layer as the second capacitor plate, and another part of the conductive pattern may be provided in the same layer as the gate electrode and the first capacitor plate, that is, the conductive pattern includes two parts alternately formed. The embodiments of the present disclosure do not limit the specific form of the conductive pattern.

For example, as illustrated in FIG. 6, the display region 201 further includes a first gate insulating layer 151 between the active layer 120 and the gate electrode 121, a second gate insulating layer 152 on the gate electrode 121, and an interlayer insulating layer 160. The second gate insulating layer 152 is located between the first capacitor plate CE1 and the second capacitor plate CE2, so that the first capacitor plate CE1, the second gate insulating layer 152, and the second capacitor plate CE2 constitute the storage capacitor Cst. The interlayer insulating layer 160 covers the second capacitor plate CE2. For example, the first insulating layer 250 in the opening peripheral region 203 includes two insulating layers, the two insulating layers are provided in the same layer as the first gate insulating layer 151 and the second gate insulating layer 152 in the display region 201, respectively, and the second insulating layer 260 in the opening peripheral region 203 and the interlayer insulating layer 160 in the display region 201 are provided in the same layer. Therefore, the manufacturing process of the display substrate 20 can be simplified.

For example, in some embodiments, as illustrated in FIG. 6, each sub-pixel in the display region 201 of the display substrate 20 further includes the light-emitting element 180. The light-emitting element 180 includes a cathode 183, an anode 181, and a light-emitting layer 182 between the cathode 183 and the anode 181. At least one of the cathode 183 and the anode 181 is electrically connected to the pixel circuit.

For example, in some embodiments, the power wire pattern 270 in the opening peripheral region 203 may be provided in the same layer as the cathode 183 in the display region 201. For example, in some examples, the cathode 183 is a full-surface structure disposed on the display substrate 20, and is used as a common electrode for the sub-pixels. In this case, the power wire pattern 270 may be a part of the cathode 183 extending to the opening peripheral region 203, that is, the power wire pattern 270 and the cathode 183 form an integrated structure that is continuously arranged. For example, the power wire pattern 270 at least partially covers the side of the conductive pattern 240 away from the base substrate 210 and is in contact with the conductive pattern 240 to achieve electrical connection, as illustrated in FIG. 5C; or, in other examples, the power wire pattern 270 is electrically connected to the conductive pattern 240 through the via. Therefore, the power wire pattern 270 can transmit the same electrical signal as the cathode 183 for the conductive pattern 240.

For example, in some embodiments, the power wire pattern 270 in the opening peripheral region 203 may be provided in the same layer as the anode 181 in the display region 201 and insulated from the anode 181. The power wire pattern 270 contacts the VSS power line in the opening peripheral region to be connected with the VSS power line. The power wire pattern 270 at least partially covers the side of the conductive pattern 240 away from the base substrate 210 and is in contact with the conductive pattern 240 to achieve electrical connection, so that the power wire pattern 270 can transmit the same electrical signal as the cathode 183 for the conductive pattern 240. In some embodiments, the power wire pattern 270 is further connected to the cathode 183 to provide the VSS power signal to the cathode.

In some embodiments, the power wire pattern 270 covers a part of the compensation structure (the first compensation structure and/or the second compensation structure). For example, the power wire pattern 270 is above the compensation structure at the position of the first dam 281 and the second dam 282, and the power wire pattern 270 is not provided above the compensation structure close to the display region 201.

For example, in other embodiments, the display region 201 further includes a first power line (described in detail later) electrically connected to the pixel circuit, and the power wire pattern 270 may be provided in the same layer as the first power line. For example, the first power line is used to provide a VDD power signal. For example, as illustrated in FIG. 3B, the power wire pattern 270, the first power line VDD, and the conductive pattern 240 are in the same layer and integrally connected with each other. For example, the first power line VDD may provide a power signal for the sub-pixel P in the third sub-display region 2013; or, in some examples, the power wire pattern 270 serves as a connection electrode to electrically connect the first power line to the conductive pattern 240 through a via. The embodiments of the present disclosure do not limit the specific structure of the power wire pattern 270, as long as the power wire pattern 270 can realize the electrical connection between the first power wire and the conductive pattern 240. Thus, the power wire pattern 270 can transmit the same electrical signal as the first power line for the conductive pattern 240.

For example, in some embodiments, the display substrate 20 further includes other functional structures. For example, the opening peripheral region 203 of the display substrate 20 further includes the first dam 281 and the second dam 282. The first dam 281 and the second dam 282 can prevent cracks, which may be formed when the opening 201A is formed, from extending to the display region 201, so as to protect the display region 201. For example, the display region 201 further includes the insulating layer 113 (for example, a passivation layer) covering the pixel circuit and the first planarization layer 112, as illustrated in FIG. 6. For example, in other embodiments, as illustrated in FIG. 5E, the display region 201 may further include the transfer electrode 171 and the second planarization layer 114. As illustrated in FIG. 5E and FIG. 6, the display region 201 further includes the pixel definition layer 170 for defining the plurality of sub-pixels, spacers (not shown) on the pixel definition layer 170, and other structures. For example, the first dam 281 and the second dam 282 may include a multi-layer structure. For example, the first dam 281 shown in FIG. 5C includes a three-layer structure. In this case, the first dam 281 may be formed in the same layer as the planarization layer 112/114, the pixel definition layer 170, and the spacer. For example, the second dam 282 shown in FIG. 5C includes a double-layer structure. In this case, the second dam 282 may be formed in the same layer as any two of the planarization layer 112/114, the pixel definition layer 170, and the spacer. Therefore, the manufacturing process of the display substrate can be simplified.

As illustrated in FIG. 5E, in some embodiments, the anode 181 is electrically connected to the drain electrode 123 through the transfer electrode, the insulating layer 113 (for example, a passivation layer, made of silicon oxide, silicon nitride, silicon oxynitride, or the like) is further provided above the source and drain electrodes, the first planarization layer 112 is provided above the insulating layer, the transfer electrode 171 is provided above the first planarization layer 112, the second planarization layer 114 is provided above the transfer electrode 171, and the transfer electrode 171 is electrically connected to the anode 181 through a via that penetrates the second planarization layer 114, and is electrically connected to the drain electrode 123 through a via that penetrates the first planarization layer 112 and the insulating layer 113.

For example, the opening peripheral region 203 of the display substrate 20 further includes encapsulation layers 291, 292, and 293. The display region 201 further includes an encapsulation layer 190, and the encapsulation layer 190 includes a plurality of encapsulation sub-layers 191/192/193. For example, the first encapsulation layer 291 is provided in the same layer as the first encapsulation sub-layer 191 in the encapsulation layer 190, the second encapsulation layer 292 is provided in the same layer as the second encapsulation sub-layer 192 in the encapsulation layer 190, and the third encapsulation layer 293 is provided in the same layer as the third encapsulation sub-layer 193 in the encapsulation layer 190. For example, both the first encapsulation layer 291 and the third encapsulation layer 293 may include inorganic encapsulation materials, such as silicon oxide, silicon nitride, silicon oxynitride, or the like. The second encapsulation layer 292 may include organic materials, for example, resin materials or the like. The multi-layer packaging structure of the display region 201 and the opening peripheral region 203 can achieve a better packaging effect, so as to prevent impurities such as water vapor, oxygen, or the like from penetrating into the display substrate 20.

For example, in the embodiments of the present disclosure, the base substrate 210 may be a glass substrate, a quartz substrate, a metal substrate, a resin substrate, or the like. For example, the material of the base substrate 210 may include an organic material. For example, the organic material may be polyimide, polycarbonate, polyacrylate, polyetherimide, polyethersulfone, polyethylene terephthalate, polyethylene naphthalate, and other resin materials. For example, the base substrate 210 may be a flexible substrate or a non-flexible substrate, which is not limited in the embodiments of the present disclosure.

For example, the materials of the first gate insulating layer 151, the second gate insulating layer 152, the interlayer insulating layer 160, the planarization layer 112, the pixel definition layer 170, and the spacers may include inorganic insulating materials, such as silicon oxide, silicon nitride, silicon oxynitride, etc., or may include organic insulating materials, such as polyimide, polyphthalimide, acrylic resin, benzocyclobutene, phenol resin, etc. The embodiments of the present disclosure do not specifically limit the materials of the first gate insulating layer 151, the second gate insulating layer 152, the interlayer insulating layer 160, the planarization layer 112, the pixel definition layer 170, and the spacers. For example, the materials of the first gate insulating layer 151, the second gate insulating layer 152, the interlayer insulating layer 160, the planarization layer 112, the pixel definition layer 170, and the spacers may be the same or partially the same as each other, or may be different from each other. The embodiments of the present disclosure are not limited in this aspect.

For example, the material of the semiconductor pattern 220 and the active layer 120 may include semiconductor materials such as polysilicon or oxide semiconductor (for example, indium gallium zinc oxide). For example, the semiconductor pattern 220 and part of the active layer 120 may be conductive through a conductive process such as doping, so as to have higher conductivity. In this case, the semiconductor pattern 220 is a conductive semiconductor pattern.

For example, the material of the second capacitor plate CE2 and the at least one wire 230 may include metal materials or alloy materials, such as molybdenum, aluminum, titanium, etc. The materials of the gate electrode 121 and the first capacitor plate CE1 may also include metal materials or alloy materials, such as molybdenum, aluminum, titanium, etc.

For example, the material of the source and drain electrodes 133/123 and the conductive pattern 240 may include metal materials or alloy materials, such as a metal single-layer or multi-layer structure formed of molybdenum, aluminum, titanium, etc. For example, the multi-layer structure is a multi-metal-layer stack, such as a stack of three metal layers of titanium, aluminum, titanium (Ti/Al/Ti), etc.

For example, the material of the anode 181 may include at least one conductive oxide material, such as indium tin oxide (ITO), indium zinc oxide (IZO), zinc oxide (ZnO), etc., or may also include a metal with high reflectivity as a reflector layer, such as silver (Ag). The material of the cathode 183 may include metal materials, such as lithium (Li), aluminum (Al), magnesium (Mg), silver (Ag), etc.

For example, the display substrate 20 may be a display substrate, such as an organic light-emitting diode (OLED) display substrate, a quantum dot light-emitting diode (QLED) display substrate, or the like, and the specific type of the display substrate is not limited in the embodiments of the present disclosure.

For example, in the case where the display substrate 20 is an organic light-emitting diode (OLED) display substrate, the light-emitting layer 182 may include small molecular organic materials or polymer molecular organic materials, may be fluorescent light-emitting materials or phosphorescent light-emitting materials, and may emit red light, green light, blue light, white light, or the like. Moreover, according to different actual needs, in different examples, the light-emitting layer 182 may further include functional layers such as an electron injection layer, an electron transport layer, a hole injection layer, a hole transport layer, etc.

For example, in the case where the display substrate 20 is a quantum dot light-emitting diode (QLED) display substrate, the light-emitting layer 182 may include quantum dot materials, for example, silicon quantum dots, germanium quantum dots, cadmium sulfide quantum dots, cadmium selenide quantum dots, tellurium cadmium quantum dots, zinc selenide quantum dots, lead sulfide quantum dots, lead selenide quantum dots, indium phosphide quantum dots, indium arsenide quantum dots, etc. The particle size of the quantum dot is 2 nm~20 nm.

Figure 7:
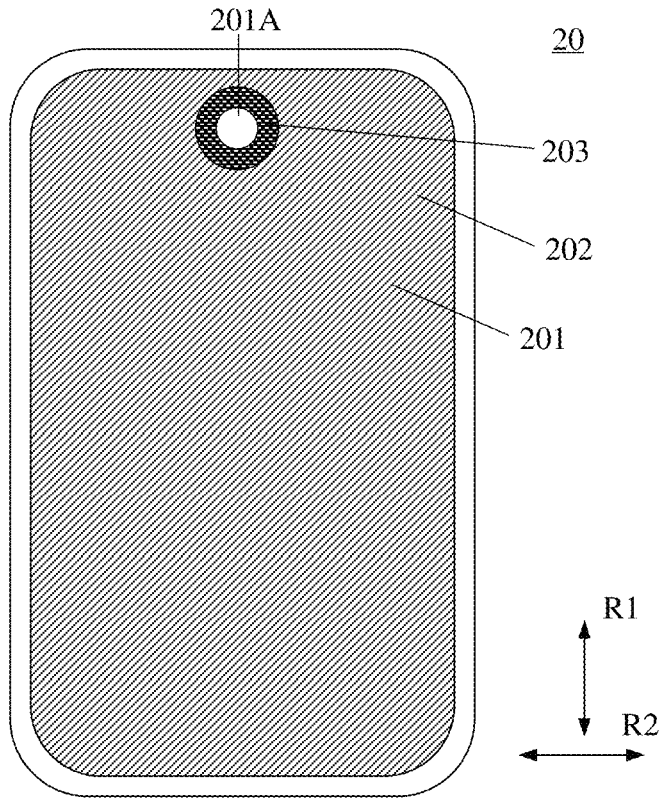
FIG. 7 is a schematic planar diagram of another display substrate provided by at least one embodiment of the present disclosure.

For example, in other embodiments of the present disclosure, as illustrated in FIG. 7, the opening 201A in the display substrate 20 may also be circular (in the case shown in the figure), drop-shaped, triangular, or other shapes. In this case, the arrangement of the display region 201, the peripheral region 202, and the opening peripheral region 203 is illustrated in FIG. 7. The embodiments of the present disclosure do not limit the specific shape of the opening 201A.

Figure 8:
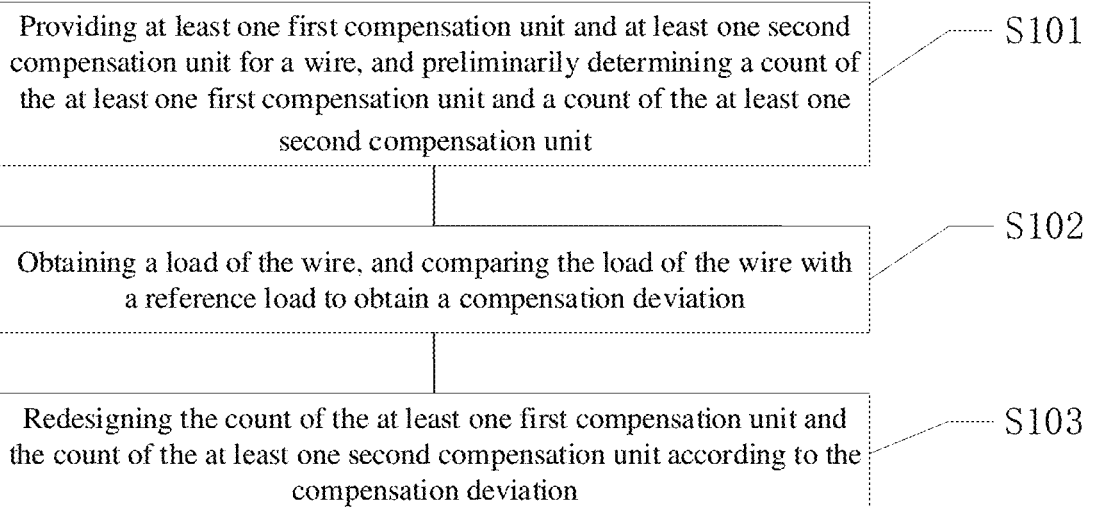
FIG. 8 is a flowchart of a compensating method for wire load provided by at least one embodiment of the present disclosure.

At least one embodiment of the present disclosure further provides a compensating method for wire load. The compensating method can be used, for example, to perform load compensation for a wire in a display substrate, so that the load of the wire reaches an ideal value. As illustrated in FIG. 8, the compensating method for wire load may include step S101 to step S103.

S101: providing at least one first compensation unit and at least one second compensation unit for a wire, and preliminarily determining a count of the at least one first compensation unit and a count of the at least one second compensation unit.

For example, referring to FIG. 2, FIG. 3A, and FIG. 5A, the display region 201 of the display substrate 20 has the opening 201A, the peripheral region 202 at least partially surrounds the display region 201, the peripheral region 202 includes the opening peripheral region 203 at least partially located in the opening 201A, at least one wire 230 is provided in the display region 201 and the opening peripheral region 203, and is configured to transmit an electrical signal for the display region 201, and opposite sides of the wire 230 are provided with the semiconductor pattern 220 and the conductive pattern 240. The wire 230 includes the first portion 2301 and the second portion 2302, the first portion 2301 is spaced apart and insulated from the semiconductor pattern 220 and the conductive pattern 240, to provide the at least one first compensation unit 230A with the first capacitor structure, and the second portion 2302 is spaced apart and insulated from one of the semiconductor pattern 220 and the conductive pattern 240, to provide the at least one second compensation unit 230B with the second capacitor structure.

For example, the display region 201 includes the first sub-display region 2011 and the second sub-display region 2012 located on opposite sides of the opening 201A. The first sub-display region 2011 and the second sub-display region 2012 respectively include a plurality of rows of sub-pixels separated by the opening 201A. The least one wire 230 passes through the first sub-display region 2011, the opening peripheral region 203, and the second sub-display region 2013 in sequence. For example, the at least one wire 230 includes a plurality of wires 230 that provide scanning signals for rows of sub-pixels in the first sub-display region 2011 and the second sub-display region 2012, respectively.

For example, the display region 201 further includes the third sub-display region 2013, and the first sub-display region 2011, the opening 201A, and the second sub-display region 2012 are sequentially arranged in the first direction R1 (that is, the horizontal direction shown in the figure). The wire 230 extends along the first direction R1, the second direction R2 (i.e., the vertical direction in the figure) is perpendicular to the first direction R1, and two opposite edges 2013A and 2013B of the third sub-display region 2013 in the second direction R2 are respectively aligned with an edge 2011A, away from the opening 201A in the second direction R2, of the first sub-display region 2011, and an edge 2012A, away from the opening 201A in the second direction R2, of the second sub-display region 2012. The third sub-display region 2013 includes sub-pixels arranged in a plurality of rows and a plurality of columns, and further includes a plurality of third wires 2303 (one third wire 2303 is shown as an example in the figure) providing a scanning signal for each row of the sub-pixels arranged in the plurality of rows and the plurality of columns and extending along the first direction R1.

For example, after the predetermined number of the first compensation unit and the second compensation unit is provided for the wire 230, the load of each wire 230 in the first sub-display region 2011 and the second sub-display region 2012 is basically the same as the load of the third wires 2303, so as to ensure the display consistency of the entire display substrate. Therefore, in the design process of the display substrate 20, the load of the third wire 2303 can be used as the reference load, and a certain number of the first compensation unit and the second compensation unit can be provided for each wire 230, so that the load of each wire 230 is substantially the same as the load of the third wires 2303.

For example, according to the load of the third wire 2303, the load of each wire 230, the load value that can be compensated by the first compensation unit, and the load value that can be compensated by the second compensation unit, the number of the first compensation unit and the number of the second compensation unit provided for each wire 230 can be preliminarily determined.

S102: obtaining a load of the wire, and comparing the load of the wire with a reference load to obtain a compensation deviation.

For example, because the above design is based on theoretical values or ideal values (such as the theoretical load of the third wire 2303, the theoretical load of each wire 230, the theoretical load value that can be compensated by the first compensation unit, and the theoretical load value that can be compensated by the second compensation unit), the actual product may deviate from the above design. Thus, after a certain number of the first compensation unit and the second compensation unit are provided for each wire 230 according to the above-mentioned preliminarily determined quantity, the actual load of each wire 230 can be obtained through simulation or actual testing, and then the actual load of each wire 230 may be compared with the reference load (for example, the actual load of the third wire 2303) to obtain the compensation deviation, so as to adjust the number of the first compensation unit and the number of the second compensation unit, so that the load of each wire 230 in the final products obtained may be substantially equal to the reference load, for example, the load of each wire 230 is substantially the same as the load of the third wire 2303.

S103: redesigning the count of the at least one first compensation unit and the count of the at least one second compensation unit according to the compensation deviation.

For example, after the aforementioned compensation deviation is obtained, the number of the first compensation unit and the number of the second compensation unit can be redesigned according to the deviation value to eliminate the compensation deviation, so that the load of each wire 230 is substantially equal to the reference load (for example, the load of the third wire 2303).

After the wire in the display substrate is compensated by the above compensating method, the load of the wire can reach an ideal value, so that the display effect of the display substrate can be improved.

At least one embodiment of the present disclosure further provides a manufacturing method of a display substrate, which includes: forming a display region and a peripheral region at least partially surrounding the display region. An opening is formed in the display region, and the opening is formed by, for example, mechanical stamping or laser cutting method after forming part of the functional layers in the display region. The peripheral region includes an opening peripheral region at least partially in the opening. The display substrate includes a base substrate, a semiconductor pattern, at least one wire, and a conductive pattern; the semiconductor pattern and the conductive pattern are formed on the base substrate and in the opening peripheral region, the at least one wire is formed in the display region and the opening peripheral region, and is configured to transmit an electrical signal for the display region; each of the at least one wire includes a first portion and a second portion; and in a direction perpendicular to the base substrate, the first portion is spaced apart and insulated from the semiconductor pattern and the conductive pattern, to provide at least one first compensation unit with a first capacitor structure, and the second portion is spaced apart and insulated from one of the semiconductor pattern and the conductive pattern, to provide at least one second compensation unit with a second capacitor structure.

For example, in some embodiments, the semiconductor pattern is formed on the base substrate, the at least one wire is formed on a side of the semiconductor pattern away from the base substrate, the conductive pattern is formed on a side of the at least one wire away from the semiconductor pattern, and in the direction perpendicular to the base substrate, the second portion does not overlap with the semiconductor pattern, so as to allow the second portion to be only spaced apart and insulated from the conductive pattern to provide the second capacitor structure.

For example, in some embodiments, the manufacturing method of the display substrate further includes: forming a first insulating layer and a second insulating layer. The first insulating layer is formed on a side of the semiconductor pattern away from the base substrate, the at least one wire is formed on a side of the first insulating layer away from the semiconductor pattern, the second insulating layer is formed on a side of the at least one wire away from the first insulating layer, and the conductive pattern is formed on a side of the second insulating layer away from the at least one wire, so that the semiconductor pattern and the wire are spaced apart and insulated from each other by the first insulating layer, and the conductive pattern and the wire are spaced apart and insulated from each other by the second insulating layer. For example, the first insulating layer and the second insulating layer have a via, and the semiconductor pattern is electrically connected to the conductive pattern through the via in the first insulating layer and the second insulating layer, so that the semiconductor pattern and the conductive pattern are provided with the same electrical signal.

For example, in some embodiments, forming the display region further includes forming a pixel circuit, the pixel circuit includes a thin film transistor and a storage capacitor, the thin film transistor includes an active layer, a gate electrode, a source electrode, and a drain electrode, and the storage capacitor includes a first capacitor plate and a second capacitor plate. The semiconductor pattern and the active layer are formed in an identical layer, the gate electrode and the first capacitor plate are formed in an identical layer, the at least one wire and the second capacitor plate are formed in an identical layer, and the conductive pattern, the source electrode, and the drain electrode are formed in an identical layer. Thus, the manufacturing process of the display substrate can be simplified.

For example, in some embodiments, the manufacturing method of the display substrate further includes: forming a first power line electrically connected to the pixel circuit and a power wire pattern electrically connected to the conductive pattern, the power wire pattern is configured to provide an electrical signal for the conductive pattern, and the power wire pattern and the first power line are formed in an identical layer.

For example, in some other embodiments, the manufacturing method of the display substrate further includes: forming a power wire pattern electrically connected to the conductive pattern, and the power wire pattern is configured to provide a fixed electrical signal for the conductive pattern; and forming the display region further includes forming a light-emitting element, the light-emitting element includes a cathode, an anode, and a light-emitting layer between the cathode and the anode, and the power wire pattern and the anode are formed in an identical layer.

In the following, the above-mentioned display substrate and the manufacturing method thereof will be introduced in combination with the pixel circuit and layout of the display substrate.

Figure 9:
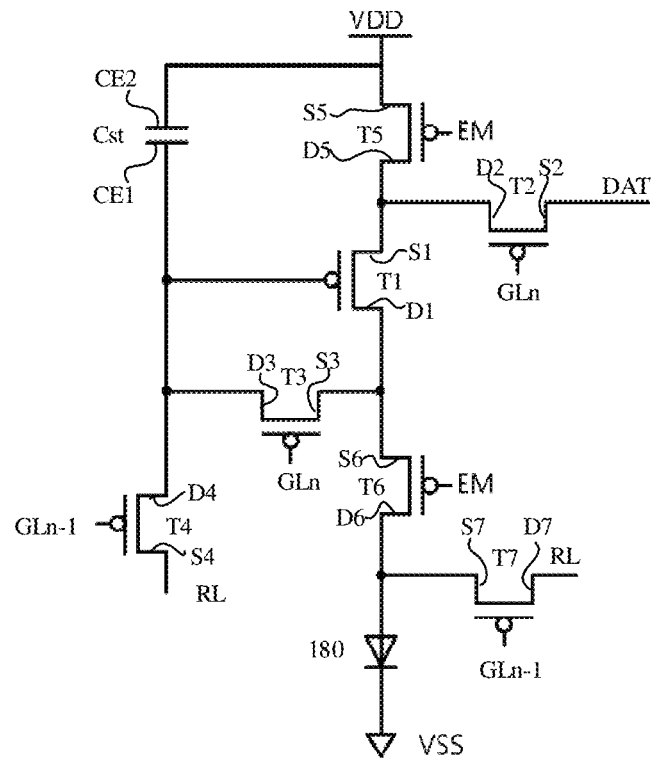
FIG. 9 is an equivalent circuit diagram of a pixel circuit in a display substrate provided by at least one embodiment of the present disclosure.

FIG. 9 is an equivalent circuit diagram of a pixel circuit in a display substrate provided by at least one embodiment of the present disclosure, and FIG. 10A to FIG. 10E are schematic diagrams of respective layers of a pixel circuit in a display substrate provided by some embodiments of the present disclosure.

In some embodiments, as illustrated in FIG. 9, the pixel circuit includes a plurality of thin film transistors T1, T2, T3, T4, T5, T6, and T7, signal lines connected to the thin film transistors T1, T2, T3, T4, T5, T6, and T7, and a storage capacitor Cst. The signal lines include a gate line GL (i.e., a scanning signal line), a light-emitting control line EM, an initialization line RL, a data line DAT, and a first power line VDD. The gate line GL may include a first gate line GLn and a second gate line GLn-1. For example, the first gate line GLn may be used to transmit a gate scanning signal, and the second gate line GLn-1 may be used to transmit a reset signal. The light-emitting control line EM may be used to transmit a light-emitting control signal. Therefore, the pixel circuit is a 7T1C pixel circuit.

It should be noted that the embodiments of the present disclosure include but are not limited thereto, and the pixel circuit may also adopt other types of circuit structures, such as a 7T2C structure, a 9T2C structure, etc., which is not limited in the embodiments of the present disclosure.

For example, the first gate line GLn of the pixel circuits corresponding to each row of sub-pixels located on the left and right sides of the opening of the display region 201 can be electrically connected through the wire 230 to transmit the gate scanning signal, thereby achieving the compensation effect of the gate scanning signal.

For example, as illustrated in FIG. 9, the first gate electrode G1 of the first thin film transistor T1 is electrically connected to the third drain electrode D3 of the third thin film transistor T3 and the fourth drain electrode D4 of the fourth thin film transistor T4. The first source electrode S1 of the first thin film transistor T1 is electrically connected to the second drain electrode D2 of the second thin film transistor T2 and the fifth drain electrode D5 of the fifth thin film transistor T5. The first drain electrode D1 of the first thin film transistor T1 is electrically connected to the third source electrode S3 of the third thin film transistor T3 and the sixth source electrode S6 of the sixth thin film transistor T6.

For example, as illustrated in FIG. 9, the second gate electrode G2 of the second thin film transistor T2 is configured to be electrically connected to the first gate line GLn to receive the gate scanning signal, the second source electrode S2 of the second thin film transistor T2 is configured to be electrically connected to the data line DAT to receive a data signal, and the second drain electrode D2 of the second thin film transistor T2 is electrically connected to the first source electrode S1 of the first thin film transistor T1.

For example, as illustrated in FIG. 9, the third gate electrode G3 of the third thin film transistor T3 is configured to be electrically connected to the first gate line GLn, the third source electrode S3 of the third thin film transistor T3 is electrically connected to the first drain electrode D1 of the first thin film transistor T1, and the third drain electrode D3 of the third thin film transistor T3 is electrically connected to the first gate electrode G1 of the first thin film transistor T1.

For example, as illustrated in FIG. 9, the fourth gate electrode G4 of the fourth thin film transistor T4 is configured to be electrically connected to the second gate line GLn-1 to receive a reset signal, the fourth source electrode S4 of the fourth thin film transistor T4 is configured to be electrically connected to the initialization line RL to receive the initialization signal, and the fourth drain electrode D4 of the fourth thin film transistor T4 is electrically connected to the first gate electrode G1 of the first thin film transistor T1.

For example, as illustrated in FIG. 9, the fifth gate electrode G5 of the fifth thin film transistor T5 is configured to be electrically connected to the light-emitting control line EM to receive the light-emitting control signal, the fifth source electrode S5 of the fifth thin film transistor T5 is configured to be electrically connected to the first power line VDD to receive the first power signal, and the fifth drain electrode D5 of the fifth thin film transistor T5 is electrically connected to the first source electrode S1 of the first thin film transistor T1.

For example, as illustrated in FIG. 9, the sixth gate electrode G6 of the sixth thin film transistor T6 is configured to be electrically connected to the light-emitting control line EM to receive the light-emitting control signal, the sixth source electrode S6 of the sixth thin film transistor T6 is electrically connected to the first drain electrode D1 of the first thin film transistor T1, and the sixth drain electrode D6 of the sixth thin film transistor T6 is electrically connected to the first display electrode (for example, the anode) of the light-emitting element 180.

For example, as illustrated in FIG. 9, the seventh gate electrode G7 of the seventh thin film transistor T7 is configured to be electrically connected to the second gate line GLn-1 to receive a reset signal, the seventh source electrode S7 of the seventh thin film transistor T7 is electrically connected to the first display electrode (for example, the anode 181) of the light-emitting element 180, and the seventh drain electrode D7 of the seventh thin film transistor T7 is configured to be electrically connected to the initialization line RL to receive the initialization signal. For example, the seventh drain electrode D7 of the seventh thin film transistor T7 may be electrically connected to the initialization line RL by being connected to the fourth source electrode S4 of the fourth thin film transistor T4.

For example, as illustrated in FIG. 9, the storage capacitor Cst includes a first capacitor plate CE1 and a second capacitor plate CE2. The second capacitor plate CE2 is electrically connected to the first power line VDD, and the first capacitor plate CE1 is electrically connected to the first gate electrode G1 of the first thin film transistor T1 and the third drain electrode D3 of the third thin film transistor T3.

For example, as illustrated in FIG. 9, the second display electrode (for example, the cathode 183) of the light-emitting element 180 is electrically connected to the second power line VSS.

It should be noted that one of the first power line VDD and the second power line VSS is a power line that provides a high voltage, and the other is a power line that provides a low voltage. In the embodiment shown in FIG. 9, the first power line VDD provides a constant first voltage, and the first voltage is a positive voltage; while the second power line VSS provides a constant second voltage, and the second voltage may be a negative voltage. For example, in some examples, the second voltage may be a grounded voltage.

It should be noted that the above reset signal and the above initialization signal may be the same signal.

For example, the cathode 183 of the display substrate 20 may be configured to receive the second voltage provided by the second power line VSS. Where the power wire pattern 270 and the cathode 183 are arranged in the same layer and electrically connected, the power wire pattern 270, the conductive pattern 240, and the semiconductor pattern 220 electrically connected to the conductive pattern 240 are applied with the second voltage, thereby allowing a capacitor to be formed between the wire 230 being electrically connected to the first gate line GLn and transmitting the gate scanning signal, and the semiconductor wire 221 in the semiconductor pattern 220, so as to achieve the compensation effect. Alternatively, where the power wire pattern 270 and the first power line VDD are arranged in the same layer and electrically connected, the power wire pattern 270, the conductive pattern 240, and the semiconductor pattern 220 electrically connected to the conductive pattern 240 are applied with the first voltage, thereby allowing a capacitor to be formed between the wire 230 being electrically connected to the first gate line GLn and transmitting the gate scanning signal, and the semiconductor wire 221 in the semiconductor pattern 220, so as to achieve the compensation effect.

It should be noted that according to the characteristics of transistors, transistors can be divided into N-type transistors and P-type transistors. For the sake of clarity, the embodiments of the present disclosure take the transistors as P-type transistors (for example, P-type TFTs) as an example to illustrate the technical solution of the present disclosure in detail. That is, in the descriptions of the present disclosure, the first transistor T1, the second transistor T2, the third transistor T3, the fourth transistor T4, the fifth transistor T5, the sixth transistor T6, and the seventh transistor T7 may all be P-type transistors. However, the transistors in the embodiments of the present disclosure are not limited to P-type transistors, and those skilled in the art can also use N-type transistors (for example, N-type TFTs) to implement the functions of one or more transistors in the embodiments of the present disclosure according to actual needs.

It should be noted that the transistors used in the embodiments of the present disclosure may be thin film transistors, field effect transistors, or other switching devices with the same characteristics. The thin film transistors may include oxide semiconductor thin film transistors, amorphous silicon thin film transistors, polysilicon thin film transistors, etc. The source electrode and drain electrode of the transistor may be symmetrical in structure, so the source electrode and drain electrode can be indistinguishable in physical structure. In the embodiments of the present disclosure, the source electrode and drain electrode of all or some of the transistors can be interchanged as required.

Figure 10A:
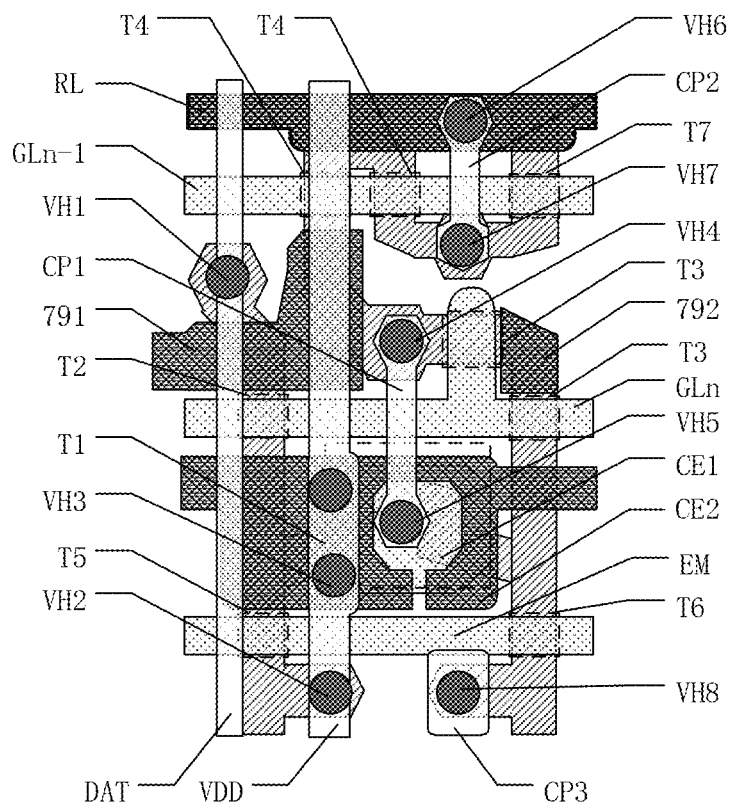
FIG. 10A to FIG. 10E are schematic diagrams of respective layers of a pixel circuit in a display substrate provided by some embodiments of the present disclosure.

In some embodiments, as illustrated in FIG. 10A, the pixel circuit includes the above-mentioned thin film transistors T1, T2, T3, T4, T5, T6, and T7, the storage capacitor Cst, and the first gate line GLn, the second gate line GLn-1, the light-emitting control line EM, the initialization line RL, the data line DAT, and the first power line VDD connected to the thin film transistors T1, T2, T3, T4, T5, T6, and T7. Hereinafter, the structure of the pixel circuit will be described with reference to FIG. 9 and FIG. 10A to FIG. 10E.

For example, FIG. 10A is a schematic diagram of the stacked positional relationship of the semiconductor layer, the first conductive layer, the second conductive layer, and the third conductive layer of the pixel circuit.

Figure 10B:
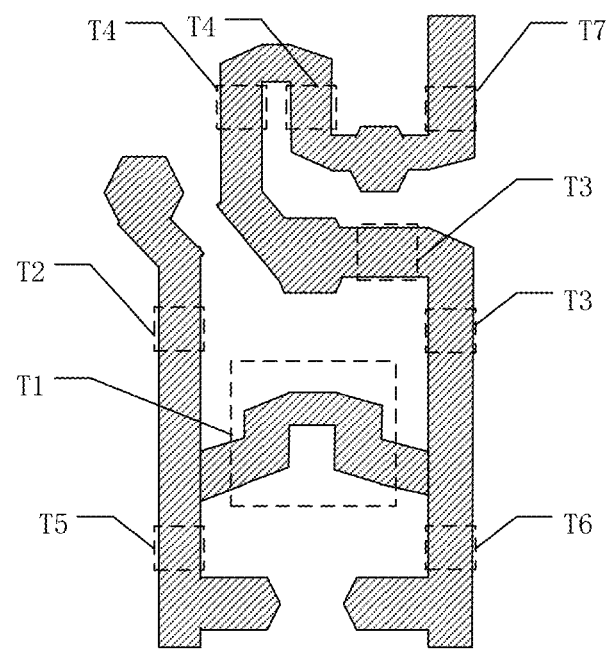

FIG. 10B shows the semiconductor layer of the pixel circuit. For example, the semiconductor layer shown in FIG. 9B includes the active layer 120 shown in FIG. 6, and the active layer 120 is, for example, the active layer of the sixth thin film transistor T6. As illustrated in FIG. 9B, the semiconductor layer may be formed by a patterning process using a semiconductor material layer. The semiconductor layer can be used to prepare the active layers of the aforementioned first thin film transistor T1, second thin film transistor T2, third thin film transistor T3, fourth thin film transistor T4, fifth thin film transistor T5, sixth thin film transistor T6, and seventh thin film transistor T7. Each active layer may include a source region, a drain region, and a channel region between the source region and the drain region. For example, the semiconductor layer may be made of amorphous silicon, polysilicon, oxide semiconductor materials, or the like. It should be noted that the aforementioned source region and drain region may be regions doped with n-type impurities or p-type impurities.

For example, the semiconductor layer of the pixel circuit may be formed in the same layer as the semiconductor pattern 220 in the opening peripheral region 203, that is, the semiconductor layer of the pixel circuit and the semiconductor pattern in the opening peripheral region 203 can be formed of the same semiconductor material layer through the same patterning process. In this case, the semiconductor pattern 220 in the opening peripheral region 203 is only formed at the position where the first portion 231 of the wire 230 will be formed later, and the semiconductor material corresponding to the formation position of the second portion 232 of the wire 230 is etched, so that the semiconductor pattern 220 does not overlap with the second portion 232 of the wire 230 to be formed later.

In the display substrate provided by some embodiments of the present disclosure, an insulating layer is formed on the above-mentioned semiconductor layer, and the insulating layer includes the first gate insulating layer 151 shown in FIG. 6 and a part of the first insulating layer 250, which is not shown in FIG. 10A to FIG. 10E.

Figure 10C:
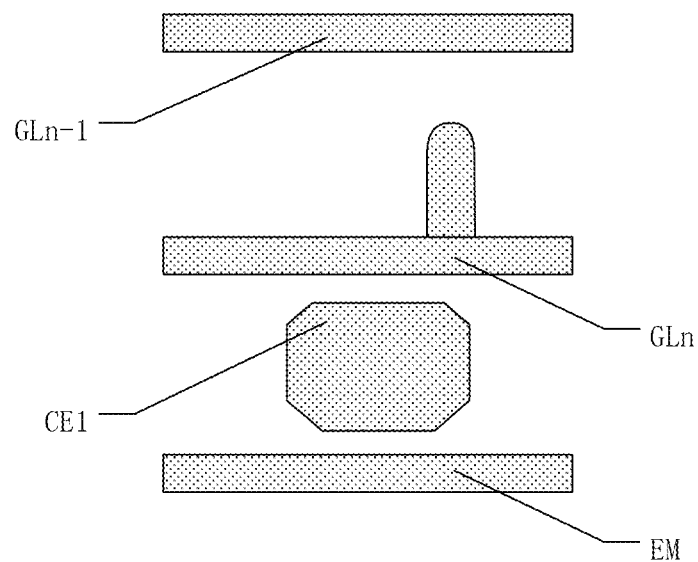

FIG. 10C shows the first conductive layer of the pixel circuit. For example, as illustrated in FIG. 10C, the first conductive layer of the pixel circuit is provided on the above-mentioned insulating layer, so as to be insulated from the semiconductor layer shown in FIG. 10B. The first conductive layer may include the first capacitor plate CE1 of the storage capacitor Cst, the first gate line GLn, the second gate line GLn-1, the light-emitting control line EM, and gate electrodes of the first thin film transistor T1, the second thin film transistor T2, the third thin film transistor T3, the fourth thin film transistor T4, the fifth thin film transistor T5, the sixth thin film transistor T6, and the seventh thin film transistor T7 (for example, the aforementioned first gate electrode G1, second gate electrode G2, third gate electrode G3, fourth gate electrode G4, fifth gate electrode G5, sixth gate electrode G6, and seventh gate electrode G7). As illustrated in FIG. 10C, the gate electrodes of the second thin film transistor T2, the fourth thin film transistor T4, the fifth thin film transistor T5, the sixth thin film transistor T6, and the seventh thin film transistor T7 are portions of the first gate line GLn, the second gate line GLn-1, and the light-emitting control line EM, which are overlapped with the semiconductor layer. The third thin film transistor T3 may be a thin film transistor with a double-gate structure, one gate electrode of the third thin film transistor T3 may be a portion of the first gate line GLn overlapped with the semiconductor layer, and the other gate electrode of the third thin film transistor T3 may be an extending portion protruding from the first gate line GLn. The gate electrode of the first thin film transistor T1 may be the first capacitor plate CE1. The fourth thin film transistor T4 may be a thin film transistor with a double-gate structure, and the two gate electrodes are respectively the overlapped portions of the second gate line GLn−1 with the semiconductor layer.

In the display substrate provided by some embodiments of the present disclosure, another insulating layer is formed on the above-mentioned first conductive layer, and the insulating layer includes the second gate insulating layer 152 shown in FIG. 6 and another part of the first insulating layer 250, which is not shown in FIG. 10A to FIG. 10E.

Figure 10D:
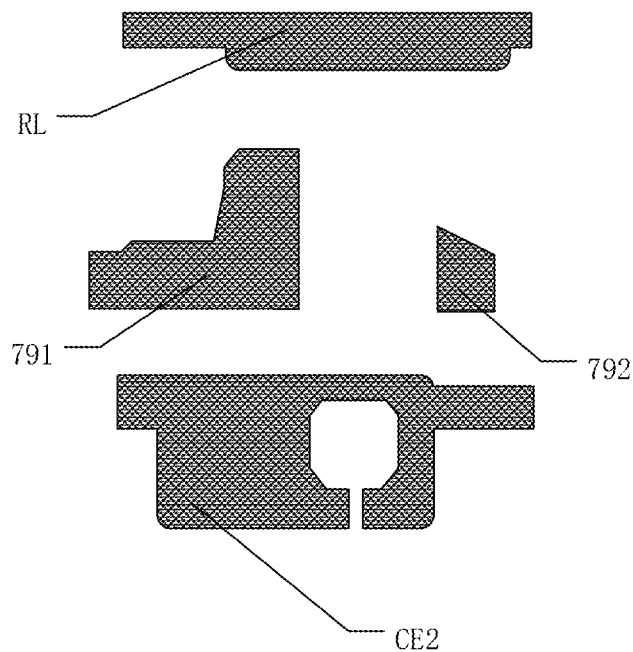

FIG. 10D shows the second conductive layer of the pixel circuit. For example, as illustrated in FIG. 10D, the second conductive layer of the pixel circuit includes the second capacitor plate CE2 of the storage capacitor Cst and the initialization line RL. The second capacitor plate CE2 and the first capacitor plate CE1 at least partially overlap to form the storage capacitor Cst.

For example, the second capacitor plate CE2 shown in FIG. 10D has a notch. In some embodiments, the second capacitor plate CE2 may not have the notch. The embodiments of the present disclosure do not limit the specific structure of the second capacitor plate CE2.

For example, the wire 230 in the opening peripheral region 203 and the second conductive layer of the pixel circuit are formed in the same layer, that is, the wire 230 in the opening peripheral region 203 and the second conductive layer of the pixel circuit are formed of the same conductive material layer by the same patterning process, that is, the wire 230, the second capacitor electrode CE2, and the initialization line RL are formed through the same conductive material layer and the same patterning process.

In some embodiments, the second conductive layer may further include a first light shielding portion 791 and a second light shielding portion 792. The orthographic projection of the first light shielding portion 791 on the base substrate 210 covers the active layer of the second thin film transistor T2, and the active layer between the drain electrode of the third thin film transistor T3 and the drain electrode of the fourth thin film transistor T4, thereby preventing external light from affecting the active layers of the second thin film transistor T2, the third thin film transistor T3, and the fourth thin film transistor T4. The orthographic projection of the second light shielding portion 792 on the base substrate 210 covers the active layer between the two gate electrodes of the third thin film transistor T3, thereby preventing external light from affecting the active layer of the third thin film transistor T3. The first light shielding portion 791 may be an integral structure with the second light shielding portion 792 of adjacent pixel circuits, and is electrically connected to the first power line VDD through a via penetrating the insulating layer.

In the display substrate provided by some embodiments of the present disclosure, another insulating layer is formed on the above-mentioned second conductive layer, and the insulating layer includes the interlayer insulating layer 160 and the second insulating layer 260 shown in FIG. 6, which is not shown in FIG. 10A to FIG. 10E.

Figure 10E:
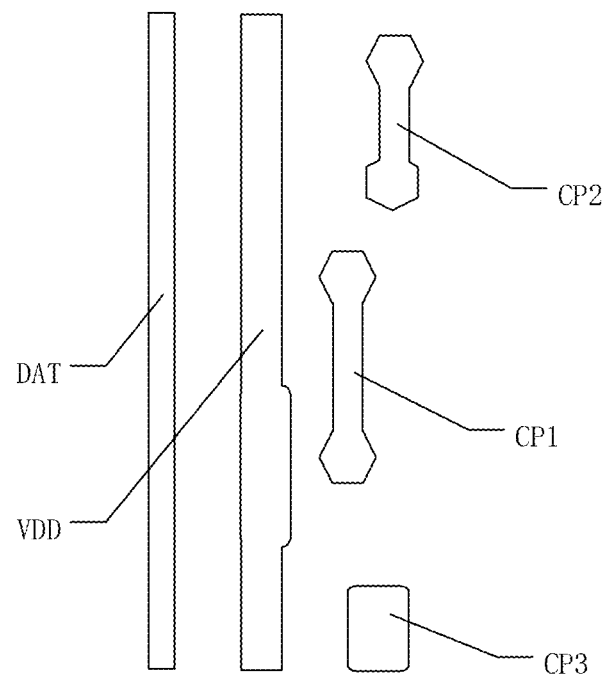

FIG. 10E shows the third conductive layer of the pixel circuit. For example, as illustrated in FIG. 10E, the third conductive layer of the pixel circuit includes a data line DAT and a first power line VDD. As illustrated in FIG. 10A and FIG. 10E, the data line DAT is connected to the source region of the second thin film transistor T2 in the semiconductor layer through at least one via (such as a via VH1) in the first gate insulating layer, the second gate insulating layer, and the interlayer insulating layer. The first power line VDD is connected to the source region of the fifth thin film transistor T5 in the semiconductor layer through at least one via (for example, a via VH2) in the first gate insulating layer, the second gate insulating layer, and the interlayer insulating layer. The first power line VDD is connected to the second capacitor plate CE2 in the second conductive layer through at least one via (for example, a via VH3) in the interlayer insulating layer.

For example, in some embodiments (corresponding to the example of FIG. 5B), the conductive pattern 240 and the power wire pattern 270 in the opening peripheral region 203 are formed in the same layer as the third conductive layer of the pixel circuit, that is, formed of the same conductive material layer and by the same patterning process. For example, the conductive pattern 240 and the power wire pattern 270 in the opening peripheral region 203 are formed in the same layer as the first power line VDD and electrically connected to the first power line VDD, so that the conductive pattern 240, the power wire pattern 270, and the first power line VDD transmit the same electrical signal. For example, where the semiconductor pattern 220 and the conductive pattern 240 are electrically connected, the semiconductor pattern 220, the conductive pattern 240, the power wire pattern 270, and the first power line VDD all transmit the same electrical signal.

For example, the third conductive layer further includes a first connection portion CP1, a second connection portion CP2, and a third connection portion CP3. One terminal of the first connection portion CP1 is connected to the drain region of the third thin film transistor T3 in the semiconductor layer through at least one via (for example, a via VH4) in the first gate insulating layer, the second gate insulating layer, and the interlayer insulating layer, and the other terminal of the first connection portion CP1 is connected to the gate electrode of the first thin film transistor T1 in the first conductive layer through at least one via (for example, a via VH5) in the second gate insulating layer and the interlayer insulating layer. One terminal of the second connection portion CP2 is connected to the initialization line RL through a via (for example, a via VH6) in the interlayer insulating layer, and the other terminal of the second connection portion CP2 is connected to the source region of the seventh thin film transistor T7 and the source region of the fourth thin film transistor T4 in the semiconductor layer through at least one via (for example, a via VH7) in the first gate insulating layer, the second gate insulating layer, and the interlayer insulating layer. The third connection portion CP3 is connected to the drain region of the sixth thin film transistor T6 in the semiconductor layer through at least one via (for example, a via VH8) in the first gate insulating layer, the second gate insulating layer, and the interlayer insulating layer.

Figure 10F:
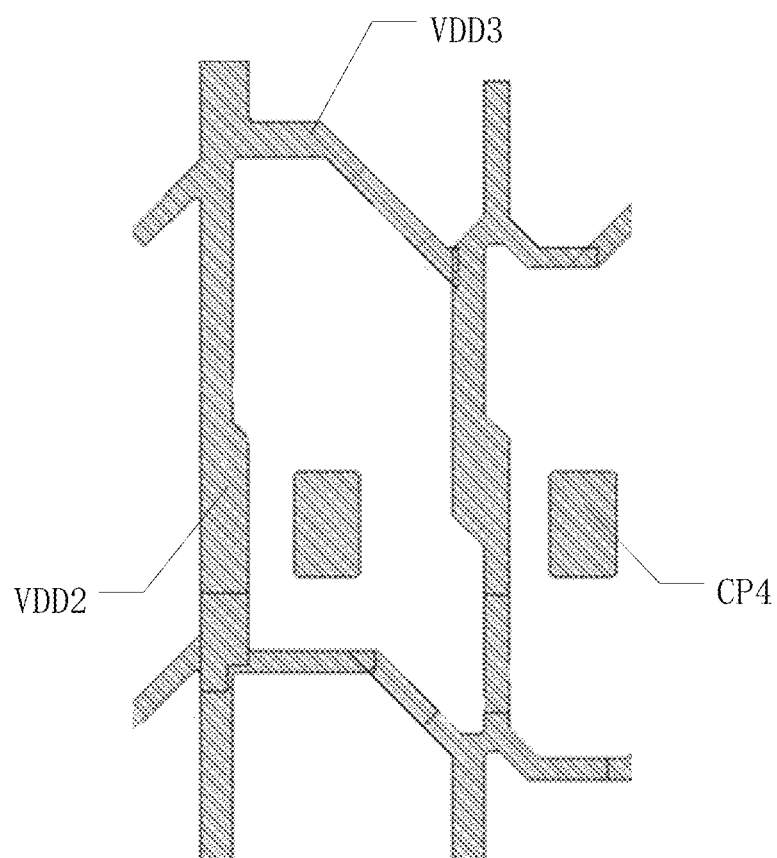
FIG. 10F is a schematic diagram of a conductive layer of a pixel circuit in a display substrate provided by some embodiments of the present disclosure.

For example, in some embodiments, the pixel circuit of the display substrate may further have a fourth conductive layer. For example, FIG. 10F shows the fourth conductive layer of the pixel circuit. As illustrated in FIG. 10F, the fourth conductive layer includes a second power line VDD2 and a third power line VDD3. The second power line VDD2 extends in the vertical direction in the figure. The third power line VDD3 and the second power line VDD2 intersect. For example, the second power line VDD2 and the third power line VDD3 are electrically connected to each other or form an integrated structure.

For example, in some embodiments, the second power line VDD2 and the third power line VDD3 are electrically connected to the first power line VDD through vias, respectively, thereby forming a mesh power line structure. This structure facilitates reducing the resistance of the power line, thereby reducing the voltage drop of the power line, and further facilitates evenly transmitting the power voltage to each sub-pixel of the display substrate.

For example, in some embodiments, the fourth conductive layer further includes a fourth connection portion CP4 insulated from the second power line VDD2 and the third power line VDD3, and the fourth connection electrode 234 is used to electrically connect the drain electrode D6 of the sixth transistor T6 to the light-emitting element 180. For example, the fourth connection electrode 234 is implemented as the transfer electrode 171 in the above embodiments, and is used to electrically connect the anode of the light-emitting element and the drain electrode of the thin film transistor.

In the display substrate provided by some embodiments of the present disclosure, a protective layer is formed on the above-mentioned fourth conductive layer, and the protective layer includes the planarization layer 112 shown in FIG. 6, which is not shown in FIG. 10A to FIG. 10E. For example, a sub-layer of the first dam 281 in the opening peripheral region 203 is formed in the same layer as the protective layer, that is, a sub-layer of the first dam 281 in the opening peripheral region 203 and the protective layer are made of the same insulating material layer and formed by the same patterning process.

For example, the wire 230 may be connected to the first gate line GLn in the first conductive layer through at least one via in the second gate insulating layer.

In some embodiments, as illustrated in FIG. 6, forming the display substrate also includes forming a buffer layer 111 on the base substrate 210. The buffer layer 111 serves as a transition layer to prevent harmful substances in the base substrate 210 from intruding into the display substrate 20, and further increase the adhesion of the film layer in the display substrate 20 on the base substrate 210. For example, the material of the buffer layer 111 may include a single-layer or multi-layer structure formed of insulating materials such as silicon oxide, silicon nitride, silicon oxynitride, etc.

For example, the protective layer of the display substrate may also be formed with the pixel definition layer, spacers, dam, light-emitting element, encapsulation layer, and other structures. The formation of these structures can refer to related technologies, which are not limited in the embodiments of the present disclosure.

Figure 11A:
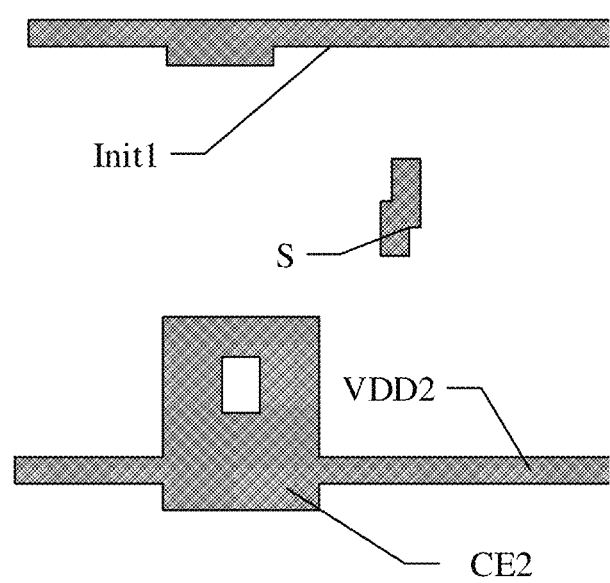
FIG. 11A is another schematic diagram of a second conductive layer of a pixel circuit in a display substrate provided by some embodiments of the present disclosure.

For example, in some embodiments, the above-mentioned conductive layers may also adopt other layout patterns. For example, FIG. 11A shows another schematic planar diagram of the second conductive layer. As illustrated in FIG. 11A, in this example, the second conductive layer includes the second capacitor plate CE2 of the storage capacitor Cst, the reset signal line Init1, the second power signal line VDD2, and the light shielding portion S. The second power signal line VDD2 is formed integrally with the second capacitor plate CE2.

Figure 11B:
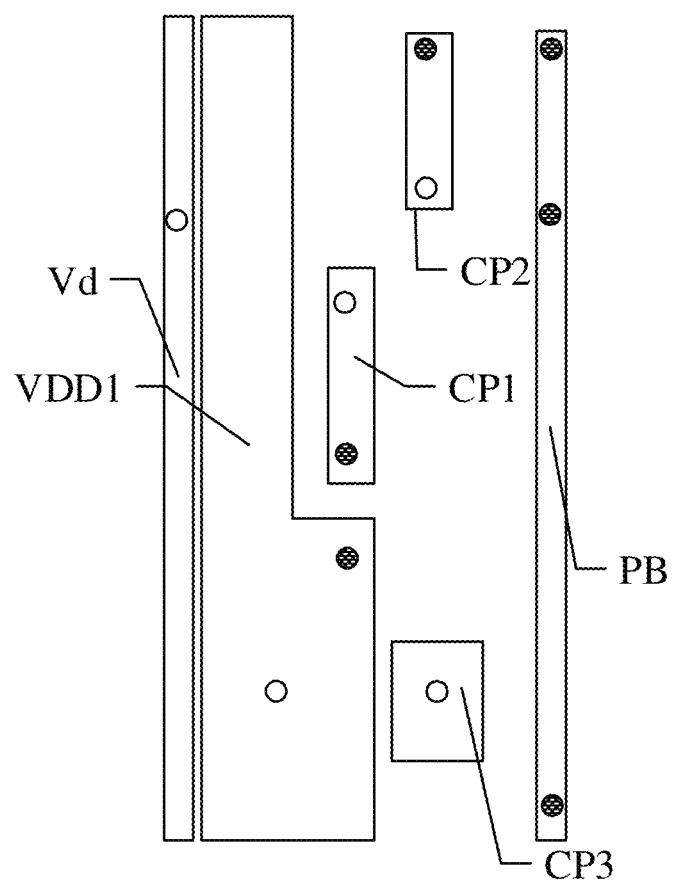
FIG. 11B is another schematic diagram of a third conductive layer of a pixel circuit in a display substrate provided by some embodiments of the present disclosure.

For example, FIG. 11B shows another schematic planar diagram of the third conductive layer. As illustrated in FIG. 11B, the third conductive layer includes the data line Vd, the first power signal line VDD1, and the shielding line PB. The above-mentioned data line Vd, the first power signal line VDD1, and the shielding line PB all extend in the same direction, such as the vertical direction in the figure. For example, the third conductive layer may further include the first connection portion CP1, the second connection portion CP2, and the third connection portion CP3 for electrically connecting different wires or electrodes.

Figure 11C:
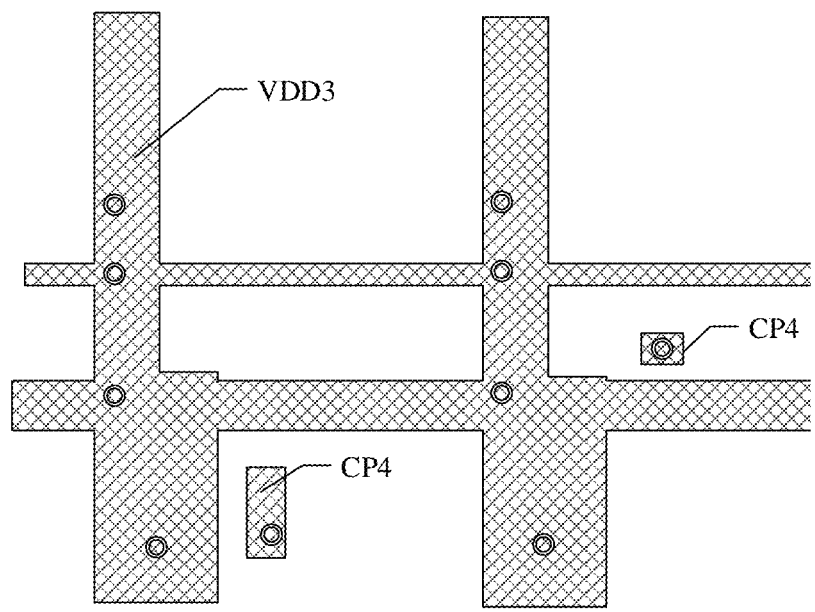
FIG. 11C is another schematic diagram of a fourth conductive layer of a pixel circuit in a display substrate provided by some embodiments of the present disclosure.

For example, FIG. 11C shows another schematic planar diagram of the fourth conductive layer. As illustrated in FIG. 11C, the fourth conductive layer includes the fourth connection portion CP4 and the third power signal line VDD3 distributed across along the vertical direction and the horizontal direction in the figure. For example, in some examples, the third power signal line VDD3 may be connected in parallel with the first power signal line VDD1 to form a mesh power structure, which is beneficial to reduce the resistance of the power signal line.

In addition, the embodiments of the present disclosure do not specifically limit the material of each structure or functional layer, and examples of the materials of the structures or functional layers can be referred to the above-mentioned embodiments, which will not be repeated here.

The following several statements should be noted:

(1) The accompanying drawings involve only the structure(s) in connection with the embodiment(s) of the present disclosure, and other structure(s) can be referred to common design(s).

(2) For clarity, in accompanying drawings for illustrating the embodiment(s) of the present disclosure, the thickness of a layer or a region may be enlarged or reduced, that is, the drawings are not drawn in an actual scale. It should be understood that, in the case that a component such as a layer, film, region, substrate or the like is referred to be "on" or "under" another component, it may be directly on or under the another component or a component is interposed therebetween.

(3) In case of no conflict, embodiments of the present disclosure and the features in the embodiments may be mutually combined to obtain new embodiments.

The above descriptions are only specific embodiments of the present disclosure, but the protection scope of the present disclosure is not limited thereto, any person who is familiar with the technical field can easily think of change or replacement within the technical scope of this disclosure, which shall be covered in the protection scope of the present disclosure. Therefore, the protection scope of the present disclosure should be determined by the protection scope of the claims.

What is claimed is:

1. A display substrate, having a display region and a peripheral region at least partially surrounding the display region, and comprising: a base substrate, a semiconductor pattern, at least one wire, and a conductive pattern,
wherein the display region has an opening, and the peripheral region comprises an opening peripheral region at least partially in the opening;
the semiconductor pattern and the conductive pattern are on the base substrate and in the opening peripheral region;
the at least one wire is in the display region and the opening peripheral region, and is configured to transmit an electrical signal for the display region;
each of the at least one wire comprises a first portion and a second portion; and
in a direction perpendicular to the base substrate, the first portion is spaced apart and insulated from the semiconductor pattern and the conductive pattern, to provide at least one first compensation unit with a first capacitor structure, and the second portion is spaced apart and insulated from one of the semiconductor pattern and the conductive pattern, to provide at least one second compensation unit with a second capacitor structure.

2. The display substrate according to claim 1, wherein the at least one wire is on a side of the semiconductor pattern away from the base substrate, and the conductive pattern is on a side of the at least one wire away from the semiconductor pattern.

3. The display substrate according to claim 1, wherein in the direction perpendicular to the base substrate, the second portion does not overlap with the semiconductor pattern, so as to allow the second portion to be only spaced apart and insulated from the conductive pattern to provide the second capacitor structure.

4. The display substrate according to claim 1, wherein the display region comprises a first sub-display region and a second sub-display region which are on opposite sides of the opening, the first sub-display region and the second sub-display region respectively comprise a plurality of rows of sub-pixels separated by the opening, and the at least one wire sequentially passes through the first sub-display region, the opening peripheral region, and the second sub-display region; and the at least one wire comprises a first wire for providing a scanning signal for a first sub-pixel row in the first sub-display region and the second sub-display region, and further comprises a second wire for providing a scanning signal for a second sub-pixel row in the first sub-display region and the second sub-display region.

5. The display substrate according to claim 4, wherein a count of sub-pixels comprised in the first sub-pixel row is identical to a count of sub-pixels comprised in the second sub-pixel row, a count of first compensation units comprised in the first wire is identical to a count of first compensation units comprised in the second wire, and a count of second compensation units comprised in the first wire is identical to a count of second compensation units comprised in the second wire.

6. The display substrate according to claim 4, wherein a count of sub-pixels comprised in the first sub-pixel row is different from a count of sub-pixels comprised in the second sub-pixel row; and a count of first compensation units comprised in the first wire is different from a count of first compensation units comprised in the second wire, or a count of second compensation units comprised in the first wire is different from a count of second compensation units comprised in the second wire, or the count of first compensation units comprised in the first wire is different from the count of first compensation units comprised in the second wire, and the count of second compensation units comprised in the first wire is different from the count of second compensation units comprised in the second wire.

7. The display substrate according to claim 4, wherein the display region further comprises a third sub-display region, the first sub-display region, the opening, and the second sub-display region are arranged sequentially in a first direction, the at least one wire extends along the first direction, and the second direction is perpendicular to the first direction;

two opposite edges of the third sub-display region in the second direction are respectively aligned with an edge, away from the opening in the second direction, of the first sub-display region, and an edge, away from the opening in the second direction, of the second sub-display region; and the third sub-display region comprises sub-pixels arranged in a plurality of rows and a plurality of columns, and further comprises a plurality of third wires providing a scanning signal for each row of the sub-pixels arranged in the plurality of rows and the plurality of columns and extending along the first direction.

8. The display substrate according to claim 7, wherein the semiconductor pattern comprises a plurality of semiconductor wires extending along the second direction, and the conductive pattern is continuously provided on a side of the at least one wire away from the semiconductor pattern.

9. The display substrate according to claim 8, wherein a line width of the at least one wire ranges from 3 μm to 5 μm, and a line width of the semiconductor pattern ranges from 20 μm to 30 μm.

10. The display substrate according to claim 1, further comprising a first insulating layer and a second insulating layer, wherein the first insulating layer is on a side of the semiconductor pattern away from the base substrate, the at least one wire is on a side of the first insulating layer away from the semiconductor pattern, and the second insulating layer is on a side of the at least one wire away from the first insulating layer, and the conductive pattern is on a side of the second insulating layer away from the at least one wire; and the first insulating layer and the second insulating layer have a via, and the semiconductor pattern is electrically connected to the conductive pattern through the via in the first insulating layer and the second insulating layer.

11. The display substrate according to claim 10, wherein the display region further comprises a first power line electrically connected to the pixel circuit, and the power wire pattern and the first power line are provided in an identical layer.

12. The display substrate according to claim 1, further comprising a power wire pattern electrically connected to the conductive pattern, wherein the power wire pattern is configured to provide an electrical signal for the conductive pattern.

13. The display substrate according to claim 12, wherein the display region comprises a plurality of sub-pixels, and each of the sub-pixels comprises a pixel circuit; and the pixel circuit comprises a thin film transistor, the thin film transistor comprises an active layer, a gate electrode, a source electrode, and a drain electrode, and the semiconductor pattern and the active layer are provided in an identical layer.

14. The display substrate according to claim 13, wherein the pixel circuit further comprises a storage capacitor, and the storage capacitor comprises a first capacitor plate and a second capacitor plate; and the gate electrode and the first capacitor plate are provided in an identical layer, and the at least one wire and the second capacitor plate are provided in an identical layer.

15. The display substrate according to claim 13, wherein the conductive pattern, the source electrode, and the drain electrode are provided in an identical layer.

16. The display substrate according to claim 12, wherein each of the sub-pixels further comprises a light-emitting element, the light-emitting element comprises a cathode, an anode, and a light-emitting layer between the cathode and the anode, at least one of the cathode and the anode is electrically connected to the pixel circuit, and the power wire pattern and the anode are provided in an identical layer.

17. A compensating method for wire load, comprising:
providing at least one first compensation unit and at least one second compensation unit for a wire, and preliminarily determining a count of the at least one first compensation unit and a count of the at least one second compensation unit;

obtaining a load of the wire, and comparing the load of the wire with a reference load to obtain a compensation deviation; and redesigning the count of the at least one first compensation unit and the count of the at least one second compensation unit according to the compensation deviation, wherein a display region has an opening, a peripheral region at least partially surrounds the display region, the peripheral region comprises an opening peripheral region at least partially in the opening, the wire is in the display region and the opening peripheral region and is configured to transmit an electrical signal for the display region, opposite sides of the wire are provided with a semiconductor pattern and a conductive pattern, the wire comprises a first portion and a second portion, the first portion is spaced apart and insulated from the semiconductor pattern and the conductive pattern, to provide the at least one first compensation unit with a first capacitor structure, and the second portion is spaced apart and insulated from one of the semiconductor pattern and the conductive pattern, to provide the at least one second compensation unit with a second capacitor structure.

18. A manufacturing method of a display substrate, comprising:

forming a display region and a peripheral region at least partially surrounding the display region, wherein an opening is formed in the display region, and the peripheral region comprises an opening peripheral region at least partially in the opening;

the display substrate comprises a base substrate, a semiconductor pattern, at least one wire, and a conductive pattern;

the semiconductor pattern and the conductive pattern are formed on the base substrate and in the opening peripheral region, the at least one wire is formed in the display region and the opening peripheral region, and is configured to transmit an electrical signal for the display region;

each of the at least one wire comprises a first portion and a second portion; and in a direction perpendicular to the base substrate, the first portion is spaced apart and insulated from the semiconductor pattern and the conductive pattern, to provide at least one first compensation unit with a first capacitor structure, and the second portion is spaced apart and insulated from one of the semiconductor pattern and the conductive pattern, to provide at least one second compensation unit with a second capacitor structure.

19. The manufacturing method of the display substrate according to claim 18, wherein the at least one wire is formed on a side of the semiconductor pattern away from the base substrate;

the conductive pattern is formed on a side of the at least one wire away from the semiconductor pattern; and in the direction perpendicular to the base substrate, the second portion does not overlap with the semiconductor pattern, so as to allow the second portion to be only spaced apart and insulated from the conductive pattern to provide the second capacitor structure.

20. The manufacturing method of the display substrate according to claim 19, further comprising: forming a first insulating layer and a second insulating layer, wherein the first insulating layer is formed on a side of the semiconductor pattern away from the base substrate, the at least one wire is formed on a side of the first insulating layer away from the semiconductor pattern, the second insulating layer is formed on a side of the at least one wire away from the first insulating layer, and the conductive pattern is formed on a side of the second insulating layer away from the at least one wire; and the first insulating layer and the second insulating layer have a via, and the semiconductor pattern is electrically connected to the conductive pattern through the via in the first insulating layer and the second insulating layer.

* * * * *